(12) United States Patent
Shin et al.

(10) Patent No.: US 12,693,710 B2
(45) Date of Patent: Jul. 28, 2026

(54) ELECTRONIC DEVICE

(71) Applicant: SAMSUNG DISPLAY CO., LTD.,
Yongin-si (KR)

(72) Inventors: Jaiku Shin, Hwaseong-si (KR);
Hansun Ryou, Seoul (KR); **Soyoun
Jung, Seoul (KR); Jiwon Han**,
Anyang-si (KR); Dongwoo Seo,
Suwon-si (KR); Youngeun Oh,
Hwaseong-si (KR)

(73) Assignee: Samsung Display Co., Ltd., Yongin-si
(KR)

( * ) Notice: Subject to any disclaimer, the term of this
patent is extended or adjusted under 35
U.S.C. 154(b) by 0 days.

(21) Appl. No.: 18/479,819

(22) Filed: Oct. 2, 2023

(65) Prior Publication Data

US 2024/0028169 A1 Jan. 25, 2024

Related U.S. Application Data

(63) Continuation of application No. 16/933,846, filed on
Jul. 20, 2020, now Pat. No. 11,775,121, which is a
(Continued)

(30) Foreign Application Priority Data

Sep. 29, 2017 (KR) ........................ 10-2017-0128089

(51) Int. Cl.
*G06F 1/16* (2006.01)
*G02F 1/1333* (2006.01)
(Continued)

(52) U.S. Cl.
CPC ...... *G06F 3/0443* (2019.05); *G02F 1/133305*
(2013.01); *G02F 1/13338* (2013.01);
(Continued)

(58) Field of Classification Search
CPC .... G06F 3/0443; G06F 1/1652; G06F 3/0412;
G06F 3/044; G06F 3/045;
(Continued)

(56) References Cited

U.S. PATENT DOCUMENTS 8,194,399 B2 6/2012 Ashcraft et al.
9,231,640 B2 1/2016 Yoon et al.
(Continued)

FOREIGN PATENT DOCUMENTS

CN 103582339 A 2/2014
CN 103685627 A 3/2014
(Continued)

OTHER PUBLICATIONS

Young's Modulus, Tensile Strength and Yield Strength Values for
some Materials; engineeringtoolbox.com (Year: 2006).*
(Continued)

*Primary Examiner* — Steven T Sawyer
(74) *Attorney, Agent, or Firm* — Womble Bond Dickinson
(US) LLP

(57) ABSTRACT

An electronic device includes a window having a modulus
of about 55 GPa to about 80 GPa, an panel including an
electronic element, and a plurality of adhesive layers
between the window and the panel, wherein a sum of
thicknesses of the adhesive layers is less than about 200 μm,
wherein the adhesive layers include a first adhesive layer
contacting the panel, and a second adhesive layer contacting
the window, and wherein a thickness of the first adhesive
layer is equal to or less than about ½ of the sum of the
thicknesses of the adhesive layers.

18 Claims, 11 Drawing Sheets

Related U.S. Application Data continuation of application No. 16/017,956, filed on Jun. 25, 2018, now Pat. No. 10,732,445.

(51) Int. Cl.

| | |
|---|---|
| *G06F 3/041* | (2006.01) |
| *G06F 3/044* | (2006.01) |
| *G06F 3/045* | (2006.01) |
| *H04M 1/02* | (2006.01) |
| *H05K 1/02* | (2006.01) |

(52) U.S. Cl.

CPC .......... *G06F 1/1652* (2013.01); *G06F 3/0412* (2013.01); *G06F 3/044* (2013.01); *G06F 3/045* (2013.01); *H04M 1/0214* (2013.01); *H04M 1/0268* (2013.01); *H05K 1/028* (2013.01); *B32B 2457/206* (2013.01); *B32B 2457/208* (2013.01); *G02F 2202/28* (2013.01); *G06F 2203/04102* (2013.01)

(58) Field of Classification Search

CPC ..... G06F 2203/04102; G02F 1/133305; G02F 1/13338; G02F 2202/28; H04M 1/0214; H04M 1/0268; H05K 1/028; B32B 2457/206; B32B 2457/208; C09J 7/29; G09F 9/301; H10K 59/40; H10K 77/111; H10K 50/84

See application file for complete search history.

(56) References Cited

U.S. PATENT DOCUMENTS

| | | | |
|---|---|---|---|
| 9,661,114 | B2 | 5/2017 | Jeong et al. |
| 9,911,793 | B2 | 3/2018 | Lee et al. |
| 9,923,172 | B2 | 3/2018 | Okumoto et al. |
| 9,983,714 | B2 | 5/2018 | Ahn |
| 10,064,274 | B2 | 8/2018 | Kim et al. |
| 10,074,701 | B2 | 9/2018 | Jeong et al. |
| 10,147,772 | B2 | 12/2018 | Breedlove et al. |
| 10,282,032 | B2 | 5/2019 | Song et al. |
| 10,399,310 | B2 | 9/2019 | Nodono et al. |
| 10,476,013 | B2 | 11/2019 | Shin et al. |
| 10,586,941 | B2 | 3/2020 | Lee et al. |
| 10,696,016 | B2 | 6/2020 | Lee et al. |
| 10,698,240 | B2 | 6/2020 | Kee et al. |
| 10,732,445 | B2 | 8/2020 | Shin et al. |
| 11,522,154 | B2 | 12/2022 | Kim et al. |
| 2006/0066803 | A1 | 3/2006 | Aylward et al. |
| 2011/0195240 | A1 | 8/2011 | Inenaga |
| 2012/0045861 | A1 | 2/2012 | Eguchi et al. |
| 2013/0034685 | A1 | 2/2013 | An et al. |
| 2013/0164478 | A1 | 6/2013 | Yamamoto et al. |
| 2013/0335344 | A1 | 12/2013 | Han et al. |
| 2014/0030496 | A1 | 1/2014 | Oh et al. |
| 2014/0184053 | A1 | 7/2014 | Cho et al. |
| 2014/0226275 | A1 | 8/2014 | Ko et al. |
| 2015/0200333 | A1 | 7/2015 | Okumoto et al. |
| 2015/0200375 | A1 | 7/2015 | Kim et al. |
| 2015/0201487 | A1 | 7/2015 | Kee et al. |
| 2015/0261332 | A1 | 9/2015 | Nakamura et al. |
| 2015/0266272 | A1 | 9/2015 | Lee et al. |
| 2015/0266727 | A1 | 9/2015 | Baker et al. |
| 2015/0268697 | A1 | 9/2015 | Nam et al. |
| 2015/0310776 | A1 | 10/2015 | Lee et al. |
| 2015/0346408 | A1 | 12/2015 | Mizutani et al. |
| 2016/0041658 | A1* | 2/2016 | Ting ..................... G02B 5/3025 345/173 |
| 2016/0111678 | A1 | 4/2016 | Lee et al. |
| 2017/0153668 | A1 | 6/2017 | Jang et al. |
| 2017/0162823 | A1 | 6/2017 | Kim et al. |
| 2017/0200915 | A1 | 7/2017 | Lee et al. |
| 2017/0278899 | A1 | 9/2017 | Yang et al. |
| 2017/0309867 | A1 | 10/2017 | Mun et al. |
| 2017/0317315 | A1 | 11/2017 | Yang et al. |
| 2017/0335144 | A1 | 11/2017 | Mitsui et al. |
| 2017/0357289 | A1 | 12/2017 | Ahn |
| 2017/0373281 | A1 | 12/2017 | Park et al. |
| 2018/0033834 | A1 | 2/2018 | Jun et al. |
| 2018/0081219 | A1 | 3/2018 | Kim |
| 2018/0097197 | A1 | 4/2018 | Han et al. |
| 2018/0153054 | A1 | 5/2018 | Kim et al. |
| 2018/0370207 | A1 | 12/2018 | Nodono et al. |
| 2019/0006444 | A1 | 1/2019 | Nishimura |
| 2019/0042042 | A1 | 2/2019 | Hei et al. |
| 2019/0044078 | A1 | 2/2019 | Chen |
| 2019/0193374 | A1 | 6/2019 | Yamasaki et al. |
| 2020/0064973 | A1 | 2/2020 | Mitsui et al. |
| 2020/0386917 | A1 | 12/2020 | Hashimoto et al. |
| 2021/0179901 | A1 | 6/2021 | Fujita et al. |

FOREIGN PATENT DOCUMENTS

| | | |
|---|---|---|
| CN | 104347007 A | 2/2015 |
| CN | 106409150 A | 2/2017 |
| CN | 106686908 A | 5/2017 |
| CN | 106847086 A | 6/2017 |
| CN | 106960849 A | 7/2017 |
| CN | 107003774 A | 8/2017 |
| CN | 114677922 B | 10/2024 |
| EP | 2 833 426 A2 | 2/2015 |
| EP | 3 223 122 A2 | 9/2017 |
| JP | 2011053262 A | 3/2011 |
| JP | 2011-33562 A | 12/2011 |
| JP | 2015-156371 A | 8/2015 |
| JP | 2017160416 A | 9/2017 |
| KR | 10-2013-0142405 A | 12/2013 |
| KR | 10-2014-0035620 A | 3/2014 |
| KR | 10-2015-0015224 A | 2/2015 |
| KR | 10-2015-0084260 A | 7/2015 |
| KR | 10-2015-0088101 A | 7/2015 |
| KR | 10-2015-0107621 A | 9/2015 |
| KR | 10-1579710 B1 | 12/2015 |
| KR | 20160135395 | 11/2016 |
| KR | 10-2017-0036190 A | 4/2017 |
| KR | 10-2017-0066764 A | 6/2017 |
| KR | 20170063344 | 6/2017 |
| KR | 10-2017-0084402 A | 7/2017 |
| KR | 10-2017-0108993 A | 9/2017 |
| KR | 10-2017-0113822 A | 10/2017 |
| KR | 10-2017-0121672 A | 11/2017 |
| WO | WO 2017/014287 A1 | 1/2017 |
| WO | WO 2017/038913 A1 | 3/2017 |
| WO | WO 2017/066364 A | 4/2017 |

OTHER PUBLICATIONS

Extended European Search Report for corresponding European Patent Application No. 18197549.1, dated Apr. 12, 2019, 9 pages.
Young's Modulus of materials (Engineering Toolbox) (Year: 2019).
Chinese Examination Report dated Jun. 2, 2021, issued in corresponding Chinese Patent Application No. 201811104346.0 (9 pages).
U.S. Notice of Allowance dated Jul. 9, 2019, issued in U.S. Appl. No. 16/287,985 (9 pages).
U.S. Office Action dated Sep. 24, 2020, issued in U.S. Appl. No. 16/359,681 (21 pages).
U.S. Office Action dated Jul. 8, 2021, issued in U.S. Appl. No. 16/359,681, 27 pages.
US Final Office Action dated Nov. 8, 2021, issued in U.S. Appl. No. 16/359,681 (27 pages).
Advisory Action for U.S. Appl. No. 16/017,956 dated Feb. 12, 2020, 3 pages.
Advisory Action for U.S. Appl. No. 16/359,681 dated Jan. 25, 2022, 3 pages.
Notice of Allowance for U.S. Appl. No. 16/017,956 dated Mar. 30, 2020, 5 pages.
Notice of Allowance for U.S. Appl. No. 16/359,681 dated Mar. 22, 2022, 11 pages.
Office Action for U.S. Appl. No. 16/017,956 dated Aug. 23, 2019, 22 pages.

(56)                    References Cited

OTHER PUBLICATIONS

Office Action for U.S. Appl. No. 16/017,956 dated Dec. 6, 2019, 20 pages.
Office Action for U.S. Appl. No. 16/359,681 dated Mar. 3, 2021, 22 pages.
Office Action for U.S. Appl. No. 16/359,681 dated May 7, 2021, 12 pages.
Restriction Requirement for U.S. Appl. No. 16/359,681 dated May 29, 2020, 6 pages.
Chinese Office action for CN Application No. 202210369334.0 dated Dec. 15, 2023, 6 pages.
Office Action issued by CNIPA on Jun. 5, 2026, for corresponding Chinese Patent Application No. CN202410960072.4, 6 pages.
Ma Zhiguo et al., "Optimal Thickness of Piezoelectric Components in Smart Structures," Journal of Northeastern University, vol. 19, No. 6, Dec. 1998, 4 pages with English abstract.

* cited by examiner

EA-4

WM
AM2-1
MM
AM3-1
PF
AM1-1
EP-1

EP-1

TSL
TSP    ISL

ECL
DPL
BL

AE EML CE
OLED

ELECTRONIC DEVICE

CROSS-REFERENCE TO RELATED APPLICATIONS

This application is a continuation of U.S. patent application Ser. No. 16/933,846, filed Jul. 20, 2020, which is a continuation of U.S. patent application Ser. No. 16/017,956, filed Jun. 25, 2018, now U.S. Pat. No. 10,732,445, which claims priority to and the benefit of Korean Patent Application No. 10-2017-0128089, filed Sep. 29, 2017, the entire content of all of which is incorporated herein by reference.

BACKGROUND

1. Field

Embodiments disclosed herein relate to an electronic device and, more particularly, to a foldable electronic device with improved reliability.

2. Description of the Related Art

Recently, bendable or foldable electronic devices have been actively developed. This flexible electronic device includes an electronic panel (e.g., a flexible display panel or a flexible touch panel) and various outer members. The outer members have different functions from each other. The outer members are located on at least one of one surface or another surface of the electronic device. The outer members are curved, bent, or folded together with the electronic device.

The outer members should have a relatively flexible property to be curved, bent, or folded. However, in the event that the outer members have the flexible property, although the reliability of the outer members with respect to bending stress may be improved, the reliability of the outer members with respect to an external impact may be deteriorated.

SUMMARY

Embodiments disclosed herein may provide an electronic device capable of improving reliability with respect to an external impact.

In an aspect of the disclosed embodiments, an electronic device includes a window having a modulus of about 55 GPa to about 85 GPa, an panel including an electronic element, and a plurality of adhesive layers between the window and the panel, wherein a sum of thicknesses of the adhesive layers is less than about 200 μm, wherein the adhesive layers include a first adhesive layer contacting the panel, and a second adhesive layer contacting the window, and wherein a thickness of the first adhesive layer is equal to or less than about ½ of the sum of the thicknesses of the adhesive layers.

The electronic device may further include an additional member between the panel and the window, and including at least one of an optical member or an input sensing member.

The additional member may contact the second adhesive layer.

The electronic device may further include a first additional member between the panel and the window, and a second additional member between the first additional member and the window, wherein the adhesive layers further include a third adhesive layer between the first additional member and the second additional member, and wherein the sum of the thicknesses of the adhesive layers is a sum of thicknesses of the first, second, and third adhesive layers.

The first additional member may be one of an optical member and an input sensing member, and the second additional member may be the other of the optical member and the input sensing member.

The first additional member may be one of an optical member and an input sensing member, and the second additional member may include a transparent resin.

Each of the first and second additional members may include a transparent resin.

The first adhesive layer and the second adhesive layer may contact each other.

The electronic device may further include a protective panel on the window, and an upper adhesive layer between the protective panel and the window to couple the protective panel and the window to each other.

The protective panel may have a modulus of about 1 GPa or less, and a thickness of about 50 μm or more.

The protective panel may have a modulus of about 1 GPa or more and a thickness of about 15 μm or more.

The window may include glass.

The window may have a thickness of about 80 μm or less.

The window may include a first layer including the glass, and a second layer on one surface of the first layer and including a transparent resin.

The panel may include a base substrate, a pixel layer on a front surface of the base substrate and including a plurality of pixels, and an encapsulation layer covering the pixel layer, and wherein the panel is configured to display an image on a front surface thereof.

The electronic device may further include a lower panel on a back surface of the panel, and a lower adhesive layer between the lower panel and the panel to couple the lower panel and the base substrate to each other.

The base substrate may have a modulus of about 1 GPa to about 10 GPa, and the lower panel may include a cushion layer, and a support layer between the cushion layer and the lower adhesive layer.

The cushion layer may contact the support layer.

The support layer may include one of a metal, glass, or plastic.

The base substrate may have a modulus of about 10 GPa or more, and the lower adhesive layer may have elasticity.

A folding axis may be defined on a back surface of the panel, wherein the folding axis is parallel to the back surface of the panel, and wherein the panel and the window are foldable along the folding axis.

The sum of the thicknesses of the adhesive layers may be equal to or greater than about 75 μm.

In another aspect of the disclosed embodiments, an electronic device includes an panel foldable along a folding axis extending in one direction, a window on a front surface of the panel and including glass, a protective panel on a front surface of the window, a lower panel on a back surface of the panel, and a plurality of adhesive layers between the window and the panel, and including a first adhesive layer contacting the panel, and a second adhesive layer contacting the window, wherein a sum of thicknesses of the adhesive layers is less than about 200 μm, and wherein a thickness of the first adhesive layer is equal to or less than about ½ of the sum of the thicknesses of the adhesive layers.

The electronic device may further include an optical member and an input sensing member between the panel and the window, wherein the adhesive layers further include a third adhesive layer between the optical member and the input sensing member.

The electronic device may further include a first additional member and a second additional member between the panel and the window, wherein each of the first and second additional members includes a transparent resin, wherein the panel includes a base layer, a display layer on the base layer for displaying an image, and a touch sensing layer sensing an external touch, and wherein the adhesive layers further include a third adhesive layer between the first additional member and the second additional member.

The protective panel may include at least one of polycarbonate (PC), polyethyleneterephthalate (PET), or thermoplastic polyurethane (TPU).

The window may include a first layer including the glass, and a second layer including a transparent resin and having a modulus that is lower than that of the first layer, and a sum of thicknesses of the first and second layers may be equal to or less than about 80 μm.

BRIEF DESCRIPTION OF THE DRAWINGS

The above and other aspects of the disclosed embodiments will become more apparent by describing in further detail the disclosed embodiments with reference to the accompanying drawings, in which.

DETAILED DESCRIPTION

Figure 1:
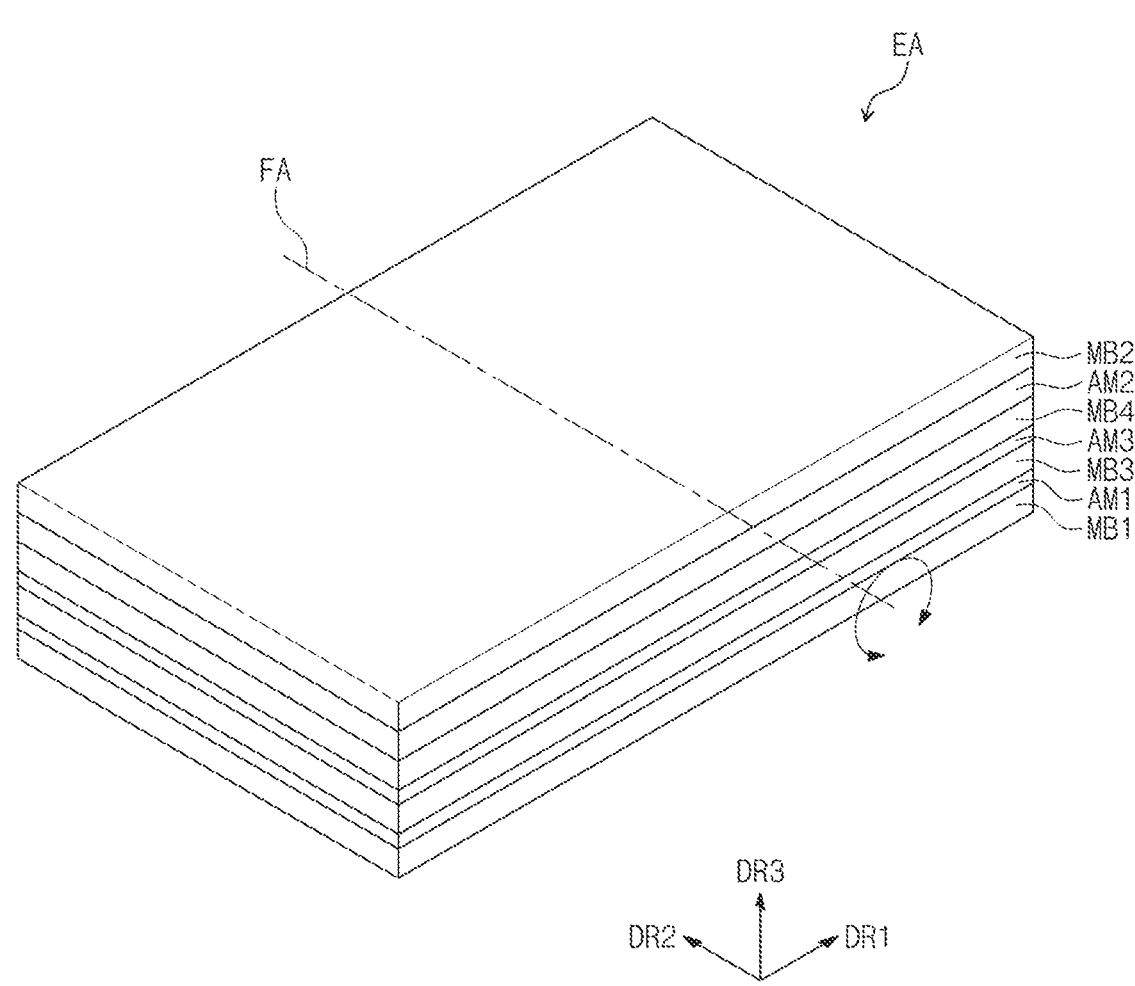
FIG. 1 is a perspective view illustrating an unfolded state of an electronic device according to an embodiment of the invention.

Features of the inventive concept and methods of accomplishing the same may be understood more readily by reference to the following detailed description of embodiments and the accompanying drawings. Hereinafter, embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, the first, second, and third directions DR1, DR2, and DR3 are not limited to three axes of a rectangular coordinate system, and may be interpreted in a broader sense. For example, the first, second, and third directions DR1, DR2, and DR3 may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, electronic devices according to embodiments disclosed herein will be described in detail with reference to the accompanying drawings.

Figure 2:
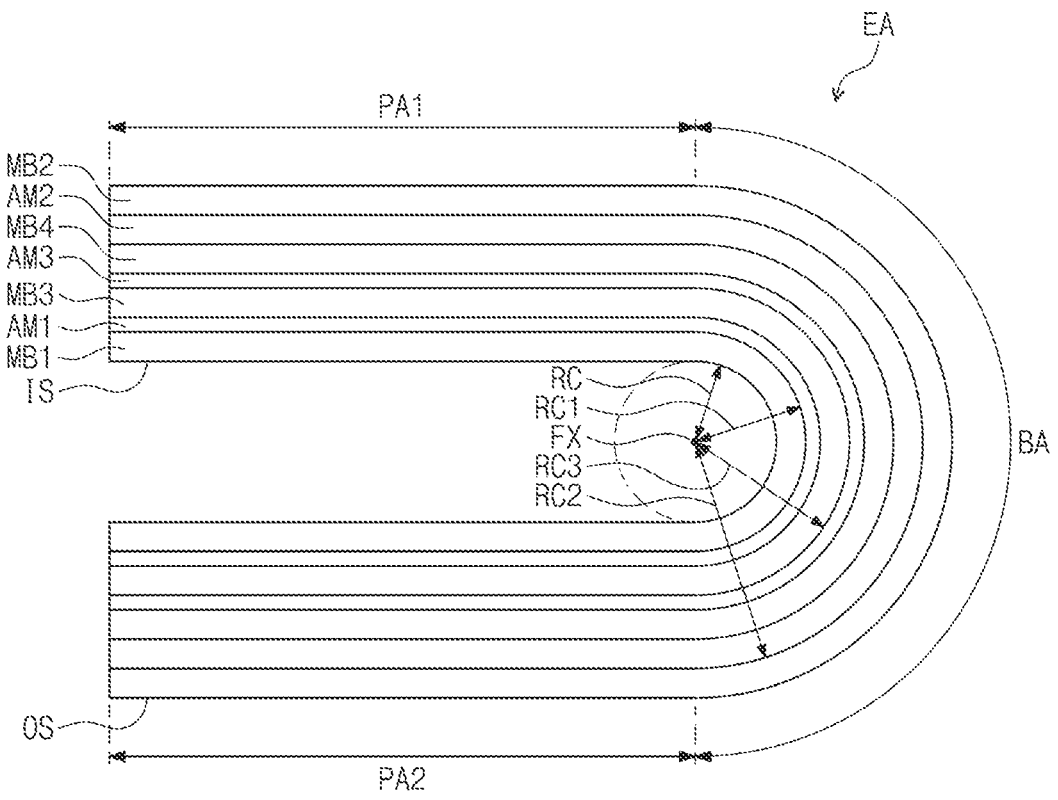
FIG. 2 is a cross-sectional view illustrating a folded state of the electronic device of FIG. 1.

FIG. 1 is a perspective view illustrating an unfolded state of an electronic device according to an embodiment of the invention. FIG. 2 is a cross-sectional view illustrating a folded state of the electronic device of FIG. 1. Hereinafter, an electronic device EA according to an embodiment of the invention will be described with reference to FIGS. 1 and 2.

The electronic device EA is driven by an electrical signal applied thereto. The electronic device EA may be, but is not limited to, a touch sensing device, a display device, or a touch screen device. In the present embodiment, the electronic device EA corresponding to the display device will be described as an example for the purpose of ease and convenience in description.

The electronic device EA may be variously deformed by external force. The electronic device EA may be unfolded, rolled to have a curved surface, or partially folded by the external force.

For example, as illustrated in FIG. 1, the electronic device EA may have an unfolded shape in a first mode. The first mode may operate, or may be used (e.g., for a specific time or purpose), and may be an unfolded state of the electronic device EA.

In the first mode, the electronic device EA may have a rectangular plate shape that has a hexahedral structure having flat surfaces that are parallel to a plane defined by first and second directions DR1 and DR2, and having a thickness defined in a third direction DR3. However, this shape is described as an example. In other embodiments, in the first mode, the electronic device EA may have one of various shapes, such as a circular plate shape or a triangular plate shape. However, the shape of the electronic device EA in the first mode is not limited to the described embodiments.

As illustrated in FIG. 2, the electronic device EA may have a folded or bent shape in a second mode. The second mode may operate for a time period that is different from that of the first mode, and may be a folded state of the electronic device EA.

The electronic device EA may be bent or folded on or along a folding axis FA in the second mode. The folding axis FA may be an imaginary line, and the electronic device EA may be bent or folded such that it surrounds the folding axis FA.

The electronic device EA may be bent or folded (e.g., bent or folded to have a predetermined radius of curvature RC). The radius of curvature RC may be defined as a shortest distance between a curvature center FX and the electronic device EA. The curvature center FX may be a point through which the folding axis FA passes. For example, the radius of curvature RC may be the shortest distance from the curvature center FX to an inner surface IS of the electronic device EA.

In the present embodiment, the radius of curvature RC may be about 10 mm or less. The electronic device EA according to an embodiment of the invention may have improved bending characteristics at relatively fine or tight curvature. This will be described later in more detail.

First to fourth members MB1 to MB4 and first to third adhesive layers AM1 to AM3 of the electronic device EA are folded on the folding axis FA. At this time, the first, second, and third adhesive layers AM1, AM2, and AM3 may be located at different distances from the curvature center FX, and thus the first, second, and third adhesive layers AM1, AM2, and AM3 may have different radii of curvature.

The first adhesive layer AM1 may have a radius of curvature that is different from that of the second adhesive layer AM2. In the present embodiment, because the first adhesive layer AM1 is closer to the curvature center FX than the second adhesive layer AM2, the radius of curvature RC2 of the second adhesive layer AM2 may be greater than the radius of curvature RC1 of the first adhesive layer AM1.

The third adhesive layer AM3 may have a radius of curvature that is different from those of the first and second adhesive layers AM1 and AM2. In the present embodiment, the first adhesive layer AM1 may be relatively close to the curvature center FX, and the second adhesive layer AM2 may be relatively distant from the curvature center FX. The third adhesive layer AM3 may be located between the first adhesive layer AM1 and the second adhesive layer AM2. Thus, the radius of curvature RC3 of the third adhesive layer AM3 may be greater than the radius of curvature RC1 of the first adhesive layer AM1, and the radius of curvature RC2 of the second adhesive layer AM2 may be greater than the radius of curvature RC3 of the third adhesive layer AM3.

However, embodiments disclosed herein are not limited thereto. In another embodiment, the electronic device EA may be bent or folded in such a way that the radius of curvature of the first adhesive layer AM1 is greater than the radius of curvature of the second adhesive layer AM2.

As illustrated in FIG. 2, the electronic device EA may include a bending area BA, a first planar area PA1, and a second planar area PA2 in the second mode. The bending area BA, the first planar area PA1, and the second planar area PA2 may be defined depending on a bent state of the electronic device EA.

The bending area BA may be relatively greatly deformed as compared to the first planar area PA1 and the second planar area PA2. Because the electronic device EA is bent on the folding axis FA, the shape of the bending area BA may be deformed. Thus, the bending area BA may be deformed to have a curved surface.

The first planar area PA1 and the second planar area PA2 may be relatively less deformed when compared to the bending area BA. In the present embodiment, each of the first and second planar areas PA1 and PA2 has a flat shape similar to the electronic device EA in the first mode.

However, embodiments disclosed herein are not limited thereto. In another embodiment, the first planar area PA1 and the second planar area PA2 may be omitted in the electronic device EA. For example, the electronic device EA may be bent or rolled in such a way that it has an entirely curved surface. In this case, an entire portion of the electronic device may correspond to the bending area BA. The electronic device EA according to embodiments disclosed herein may have at least one of various shapes in the second mode, and the embodiments disclosed herein are not limited to the above described embodiment.

The electronic device EA may include the first member MB1, the second member MB2, the third member MB3, the fourth member MB4, the first adhesive layer AM1, the second adhesive layer AM2, and the third adhesive layer AM3. In the present embodiment, the first member MB1, the third member MB3, the fourth member MB4 and the second member MB2 may be sequentially stacked in a thickness direction DR3 (i.e., the third direction DR3) of the electronic device EA.

The first adhesive layer AM1 may be located between the first member MB1 and the second member MB2. Thus, the first member MB1 and the second member MB2 may be spaced apart from each other in the third direction DR3 with the first adhesive layer AM1 interposed therebetween. Each of the first, second, third and fourth members MB1, MB2, MB3 and MB4 may be a window, a touch member, a display member, a touch screen member, an optical member, a protective member, and/or any combination thereof.

For example, the first member MB1 may be an electronic panel. The first member MB1 (hereinafter, referred to as the panel) may include an electronic element. Thus, the panel MB1 may be activated by an electrical signal applied thereto.

The panel MB1 may be variously embodied. For example, the panel MB1 may include a display panel for displaying an image, a sensing panel for sensing an external input, or a combination thereof. In the present embodiment, the panel MB1 includes the display panel. The display panel may be a liquid crystal display panel, an organic light emitting display panel, an electrophoretic display panel, or an electrowetting display panel. This will be described later in more detail.

The panel MB1 may be bent or folded on the folding axis FA. The panel MB1 may have a flexible property. Thus, the panel MB1 may be easily folded or unfolded by one or more external forces applied thereto.

The second member MB2 may be the window. The second member MB2 (hereinafter, referred to as 'the window') may be optically transparent. The window MB2 protects the panel MB1 from an external impact or external environment.

The window MB2 may have a modulus of about 55 GPa to about 85 GPa. This may mean a case in which the window MB2 substantially includes glass. Here, the window MB2 may have the modulus that is higher than a modulus of a polyimide film (e.g., a modulus of about 10 GPa). Because the window MB2 includes glass having a high modulus, the electronic device EA may have stable impact resistance even though the adhesive layers AM1 to AM3 and/or intermediate members (e.g., third and fourth members MB3 and MB4) between the window MB2 and the panel MB1 may be relatively thin in a manner similar to thin films.

Thus, the window MB2 may have high impact resistance to stably protect the panel MB1 from an external impact. In addition, the modulus of the window MB2 may be limited to a degree at which a folding characteristic of the window MB2 is not deteriorated, and thus the window MB2 may be easily folded or unfolded by external force applied thereto. As a result, the window MB2 may be easily applied to a foldable device and may also have sufficient strength to stably perform a function of a foldable window.

On the other hand, the window MB2 may have a thickness of about 80 μm or less. Because the thickness of the window MB2 is limited (e.g., limited to a specific value or less), it is possible to reduce resistance of the window MB2 with respect to a folding operation of the electronic device EA. As a result, the window MB2 may have a thin thickness even though the window MB2 includes a rigid material such as glass, and thus the window MB2 may have stable flexibility for the folding operation of the electronic device EA.

The third member MB3 may be an additional member. The third member MB3 (hereinafter, referred to as a first additional member) may include at least one of an optical member or an input sensing member/film. For example, the optical member may include at least one of a polarizing film, an anti-reflection film, a phase difference film (or a phase retardation film), or an anti-scattering film. The input sensing film may sense an externally provided touch, and may generate an electrical signal corresponding to the touch. The touch may include various external inputs, such as contact/proximity of the body (e.g., a finger), contact/proximity of a conductive object, light, heat, and pressure.

The fourth member MB4 may be an additional member. The fourth member MB4 (hereinafter, referred to as a second additional member) may include at least one of the optical member or the input sensing member. For example, the first additional member MB3 may include one of the optical member and the input sensing member, and the second additional member MB4 may include the other of the optical member and the input sensing member. Alternatively, both the first additional member MB3 and the second additional member MB4 may be the optical members or the input sensing members. According to some embodiments disclosed herein, the first additional member MB3 and the second additional member MB4 may be variously embodied, and are not limited to a specific embodiment.

The optical member may optically change incident light. The optical member may reduce a reflectance of light incident on a front surface of the electronic device EA, may guide re-reflection of light incident on a back surface of the electronic device EA, and/or may improve a transmittance of light incident on the back surface. For example, the optical member may include at least one of a polarizing film, an anti-reflection film, a phase difference film (or a phase retardation film), or an anti-scattering film.

The input sensing film may sense a touch provided from the outside, and may generate an electrical signal corresponding to the touch. The touch may include various external inputs, such as contact/proximity of the body (e.g., a finger), contact/proximity of a conductive object, light, heat, and pressure. The input sensing member may include at least one of sensors (e.g., a conductive sensor, a light sensor, and a heat sensor) capable of sensing various inputs.

Each of the first and second additional members MB3 and MB4 may include a single member or a plurality of members. Meanwhile, in another embodiment, at least one of the first additional member MB3 or the second additional member MB4 may be omitted.

A plurality of adhesive layers may be located between the panel MB1 and the window MB2. The panel MB1, the window MB2, the first additional member MB3, and the second additional member MB4 may be coupled to each other by the adhesive layers. The adhesive layers may include the first adhesive layer AM1, the second adhesive layer AM2, and the third adhesive layer AM3.

The first adhesive layer AM1 is in contact with the panel MB1. The first adhesive layer AM1 is located between the panel MB1 and the first additional member MB3. The first adhesive layer AM1 physically couples the panel MB1 and the first additional member MB3 to each other.

The first adhesive layer AM1 may be an adhesive layer formed by applying and hardening a liquid adhesive material, or may be a separately formed adhesive sheet. For example, the first adhesive layer AM1 may be formed of a pressure sensitive adhesive (PSA), an optical clear adhesive (OCA), or an optical clear resin (OCR).

The second adhesive layer AM2 is in contact with the window MB2. The second adhesive layer AM2 is located between the window MB2 and the second additional member MB4. The second adhesive layer AM2 physically couples the window MB2 and the second additional member MB4 to each other.

The second adhesive layer AM2 may be an adhesive layer formed by applying and hardening a liquid adhesive material, or may be a separately formed adhesive sheet. For example, the second adhesive layer AM2 may be formed of a pressure sensitive adhesive (PSA), an optical clear adhesive (OCA), or an optical clear resin (OCR).

The third adhesive layer AM3 is located between the first additional member MB3 and the second additional member MB4. The third adhesive layer AM3 may be in contact with the first additional member MB3 and the second additional member MB4. The third adhesive layer AM3 physically couples the first additional member MB3 and the second additional member MB4 to each other.

The third adhesive layer AM3 may be an adhesive layer formed by applying and hardening a liquid adhesive material, or may be a separately formed adhesive sheet. For example, the third adhesive layer AM3 may be formed of a pressure sensitive adhesive (PSA), an optical clear adhesive (OCA), or an optical clear resin (OCR).

The electronic device EA according to the present embodiment may have improved strength with respect to folding stress and improved impact resistance with respect to an external impact by controlling or adjusting the modulus of the window MB2 and the thickness of the first adhesive layer AM1. This will be described later in more detail.

Figure 3:
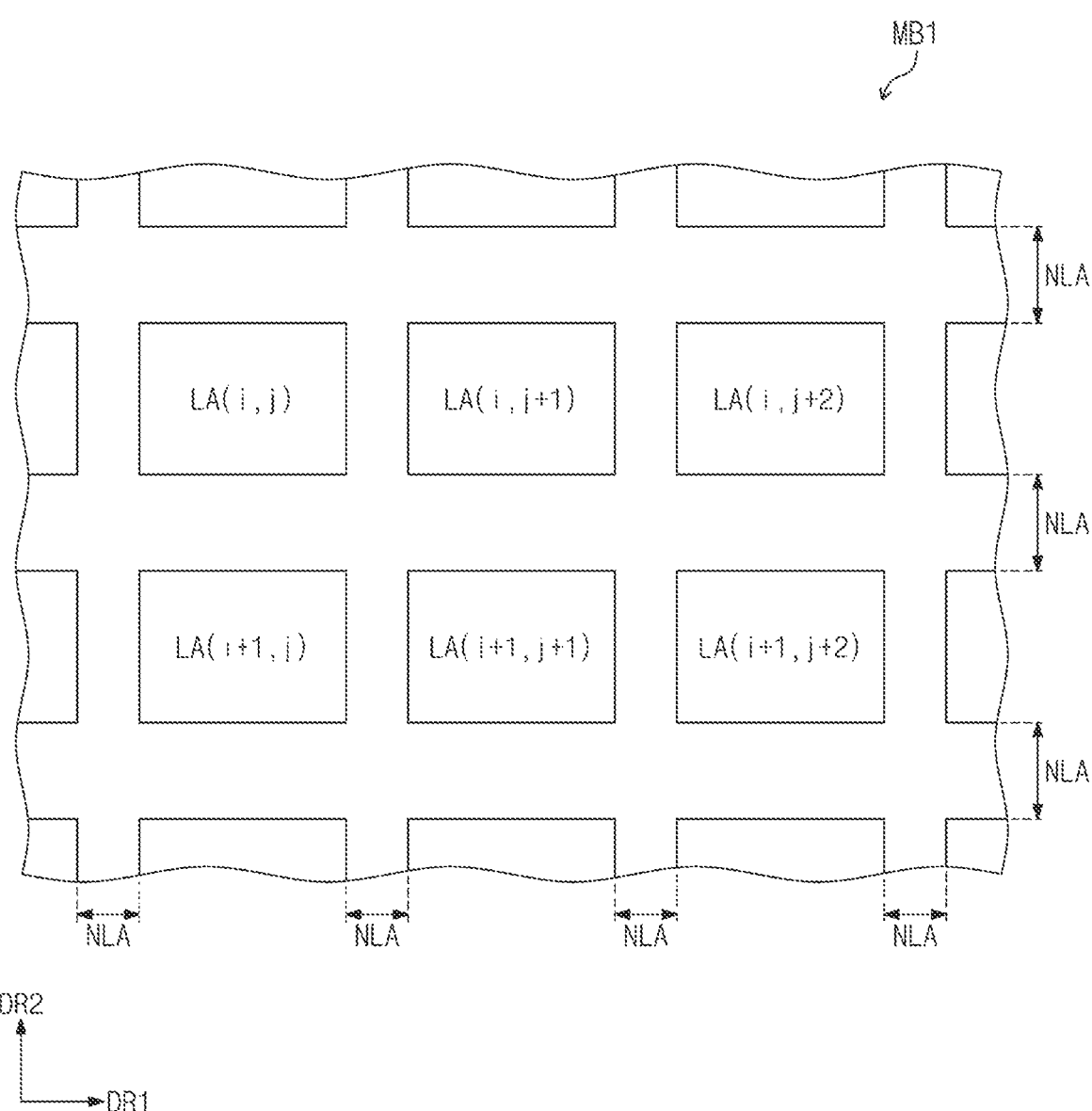
FIG. 3 is a partial plan view illustrating a portion of the electronic device of FIG. 1.
Figure 4:
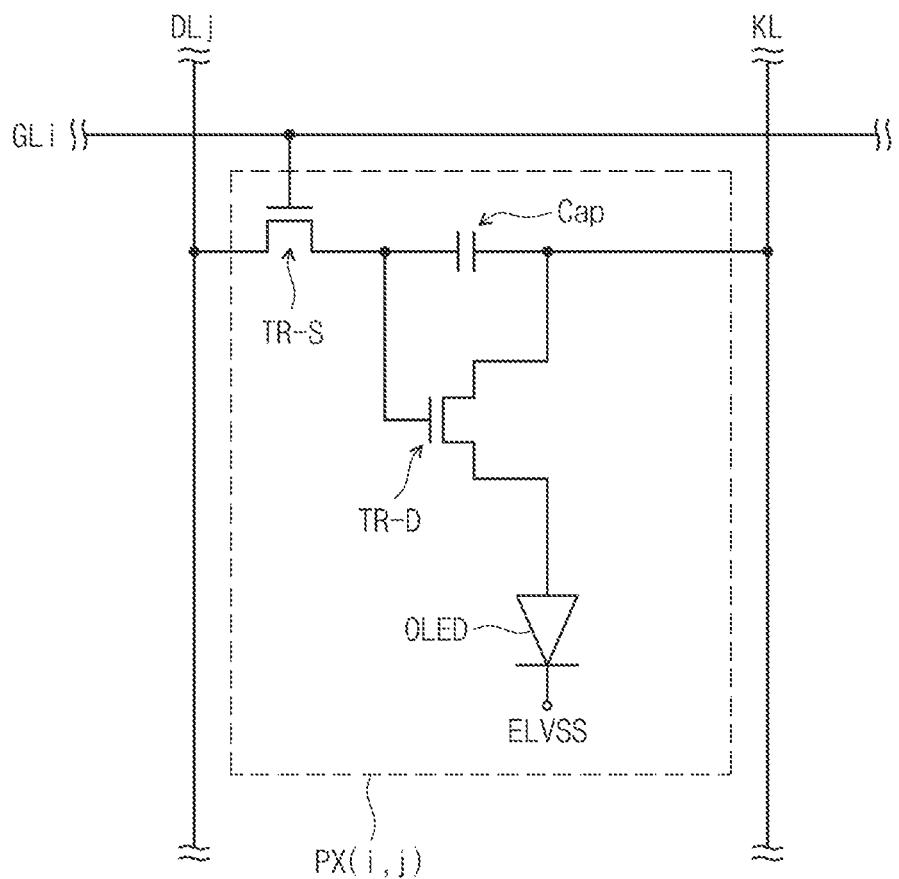
FIG. 4 is an equivalent circuit diagram of a pixel according to an embodiment of the invention.
Figure 5:
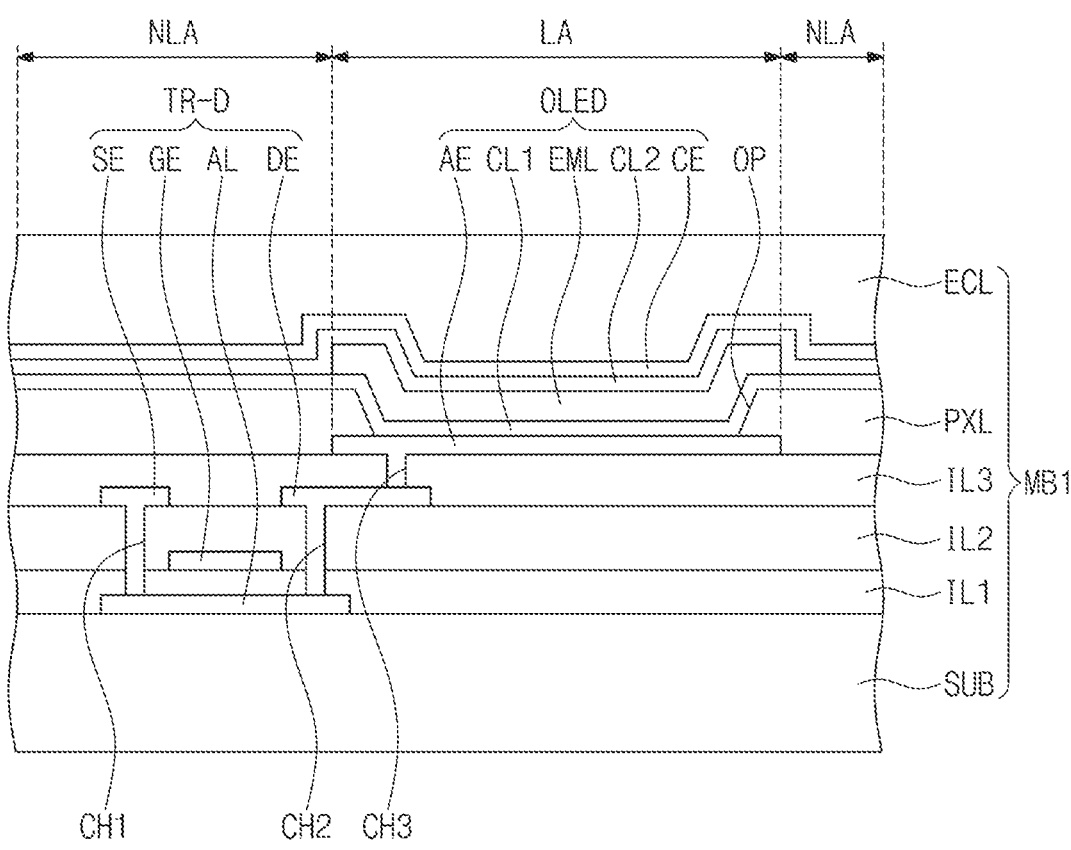
FIG. 5 is a cross-sectional view illustrating a pixel according to an embodiment of the invention.

FIG. 3 is a partial plan view illustrating a portion of the electronic device of FIG. 1. FIG. 4 is an equivalent circuit diagram of a pixel according to an embodiment of the invention. FIG. 5 is a cross-sectional view illustrating a pixel according to an embodiment of the invention.

A portion of the panel MB1 is schematically illustrated in FIGS. 3 to 5. Hereinafter, an electronic device according to an embodiment of the invention will be described with reference to FIGS. 3 to 5.

As illustrated in FIG. 3, the panel MB1 may include a plurality of light emitting areas LA(i,j) to LA(i+1,j+2) and a non-light emitting area NLA surrounding each of the light emitting areas LA(i,j) to LA(i+1,j+2) when viewed in a plan view. A portion in which six light emitting areas LA(i,j) to LA(i+1,j+2) are provided is illustrated as an example in FIG. 3.

Each of the light emitting areas LA(i,j) to LA(i+1,j+2) emits light (e.g., a respective predetermined light). The six light emitting areas LA(i,j) to LA(i+1,j+2) may emit lights having the same color as each other or different colors.

The non-light emitting area NLA may separate the light emitting areas LA(i,j) to LA(i+1,j+2) from each other. The non-light emitting area NLA may block light emitted through peripheries of the light emitting areas LA(i,j) to LA(i+1,j+2) to reduce or prevent a light leakage phenomenon, and to clearly define or divide the light emitting areas LA(i,j) to LA(i+1,j+2).

A display element for generating light may be located in each of the light emitting areas LA(i,j) to LA(i+1,j+2). In the present embodiment, the display element may be an organic light emitting element. Signal lines for providing electrical signals to the display elements may be located to overlap with the non-light emitting area NLA.

An equivalent circuit of a pixel PX(i,j) is illustrated as an example in FIG. 4. The pixel PX(i,j) includes at least one thin film transistor and the display element. FIG. 4 illustrates the embodiment in which the organic light emitting element OLED is used as the display element. However, the configuration of the pixel PX(i,j) is not limited thereto and may be variously modified.

The pixel PX(i,j) receives a gate signal from an $i^{th}$ gate line GLi, and receives a data signal from a $j^{th}$ data line DLj. The pixel PX(i,j) receives a first power source voltage from a power line KL. The pixel PX(i,j) may include a switching thin film transistor TR-S, a driving thin film transistor TR-D, and a capacitor Cap, which collectively constitute a circuit part for driving the organic light emitting element OLED.

The switching thin film transistor TR-S outputs the data signal, which is applied to the $j^{th}$ data line DLj, in response to the gate signal applied to the $i^{th}$ gate line GLi. The capacitor Cap is charged with a voltage corresponding to the data signal received from the switching thin film transistor TR-S.

The driving thin film transistor TR-D is connected to the organic light emitting element OLED. The driving thin film transistor TR-D controls a driving current flowing through the organic light emitting element OLED in response to the amount of charges stored in the capacitor Cap. The organic light emitting element OLED emits light during a turn-on period of the driving thin film transistor TR-D.

For the purpose of ease and convenience in description and illustration, FIG. 5 illustrates a cross-sectional view of a portion corresponding to the driving thin film transistor TR-D and the organic light emitting element OLED of the equivalent circuit illustrated in FIG. 4. As illustrated in FIG. 5, insulating layers IL1, IL2, and IL3, the driving thin film transistor TR-D, and the organic light emitting element OLED may be located on a base substrate SUB.

The base substrate SUB may be flexible and may have an insulating property. For example, the base substrate SUB may include a resin including polyimide (PI). This will be described later in more detail.

A semiconductor pattern AL of the driving thin film transistor TR-D is located on the base substrate SUB. A first insulating layer IL1 is located on the base substrate SUB, and covers the semiconductor pattern AL. The first insulating layer IL1 includes an organic layer and/or an inorganic layer. The first insulating layer IL1 may include a plurality of thin layers.

A control electrode GE of the driving thin film transistor TR-D is located on the first insulating layer IL1. A second insulating layer IL2 is located on the first insulating layer IL1 and covers the control electrode GE. The second insulating layer IL2 includes an organic layer and/or an inorganic layer. The second insulating layer IL2 may include a plurality of thin layers.

An input electrode SE and an output electrode DE of the driving thin film transistor TR-D are located on the second insulating layer IL2. The input electrode SE and the output electrode DE are respectively connected to portions of the semiconductor pattern AL through a first through-hole CH1 and a second through-hole CH2 penetrating the first and second insulating layers IL1 and IL2. On the other hand, in another embodiment, the driving thin film transistor TR-D may have a bottom gate structure.

A third insulating layer IL3 is located on the second insulating layer IL2 and covers the input electrode SE and the output electrode DE. The third insulating layer IL3 includes an organic layer and/or an inorganic layer. The third insulating layer IL3 may include a plurality of thin layers.

A pixel defining layer PXL and the organic light emitting element OLED are located on the third insulating layer IL3. The organic light emitting element OLED may include a first electrode AE, a first common layer CL1, an organic light emitting layer EML, a second common layer CL2, and a second electrode CE, which are sequentially stacked. The first electrode AE is connected to the output electrode DE through a third through-hole CH3 penetrating the third insulating layer IL3. Depending on a light emitting direction of the organic light emitting element OLED, positions of the first and second electrodes AE and CE may be changed with each other, and positions of the first and second common layers CL1 and CL2 may be changed with each other.

The first electrode AE is located on the third insulating layer IL3. An opening OP of the pixel defining layer PXL exposes at least a portion of the first electrode AE.

The first common layer CL1 is located on the first electrode AE. The first common layer CL1 is located in the light emitting area LA corresponding to the opening OP, and is also located in the non-light emitting area NLA. The first common layer CL1 may be a hole control region. The first common layer CL1 may induce or control smooth movement of holes, and may control the movement of the holes in such a way that the movement of the holes balances with movement of electrons. The first common layer CL1 may include a hole transfer material.

The organic light emitting layer EML is located on the first common layer CL1. The organic light emitting layer EML may be located only in an area corresponding to the opening OP. The second common layer CL2 is located on the organic light emitting layer EML. The second common layer CL2 may include an electron injection layer. The second common layer CL2 may be an electron control region. The second common layer CL2 may induce or control smooth movement of electrons, and may control the movement of the electrons in such a way that the movement of the electrons balances with movement of holes. The second common layer CL2 may include an electron transfer material.

The second electrode CE is located on the second common layer CL2. The second electrode CE is located in the light emitting area LA corresponding to the opening OP, and is also located in the non-light emitting area NLA.

An encapsulation layer ECL is located on the second electrode CE. The encapsulation layer ECL overlaps with both the light emitting area LA and the non-light emitting area NLA. The encapsulation layer ECL includes an organic layer and/or an inorganic layer. In another embodiment of the invention, a fourth insulating layer for planarization may further be located between the second electrode CE and the encapsulation layer ECL. In still another embodiment, the encapsulation layer ECL may be replaced with an encapsulation substrate.

The switching thin film transistor TR-S may have substantially the same structure as the driving thin film transistor TR-D. In addition, two electrodes of the capacitor Cap may be located on the first insulating layer IL1, the second insulating layer IL2, and the third insulating layer IL3.

Figure 6:
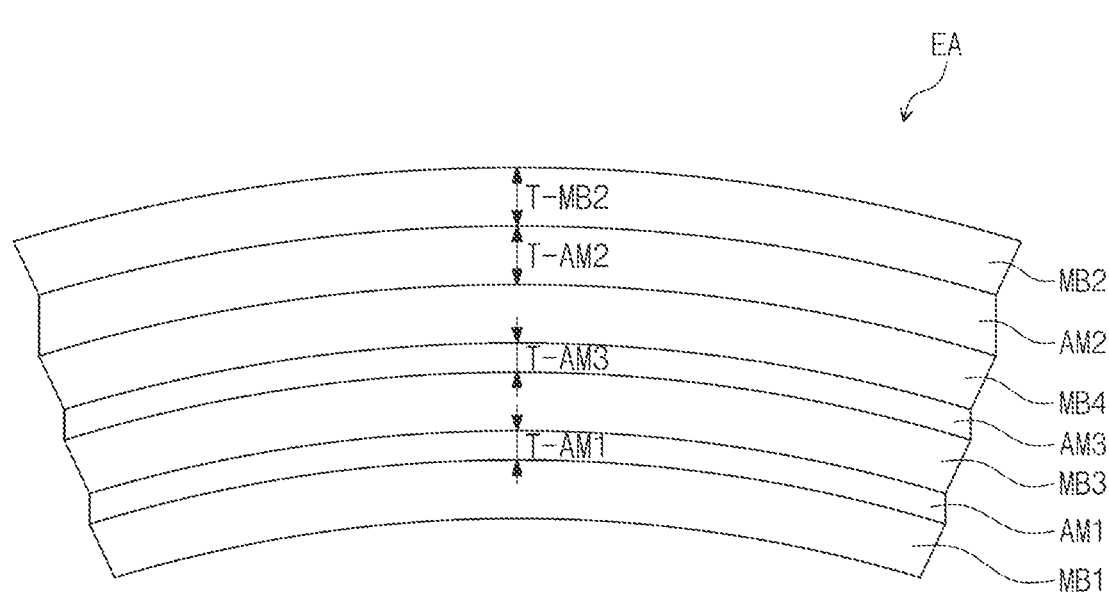
FIG. 6 is a cross-sectional view illustrating a portion of an electronic device according to an embodiment of the invention.

FIG. 6 is a cross-sectional view illustrating a portion of an electronic device according to an embodiment of the invention. FIG. 6 illustrates an electronic device bent at a curvature (e.g., at a predetermined curvature) for the purpose of ease and convenience in description. Hereinafter, the electronic device EA according to an embodiment of the invention will be described with reference to FIG. 6. Hereinafter, the same components as described with reference to FIGS. 1 to 5 will be indicated by the same reference designators, and the repeated descriptions thereto will be omitted or mentioned briefly.

FIG. 6 illustrates a thickness T-AM1 of the first adhesive layer AM1, a thickness T-AM2 of the second adhesive layer AM2, a thickness T-AM3 of the third adhesive layer AM3, and a thickness T-MB2 of the window MB2. Meanwhile, a plurality of neutral planes may be defined in the electronic device EA. The first, second, and third adhesive layers AM1, AM2, and AM3 may decouple the panel MB1, the window MB2, and the first and second additional members MB3 and MB4 from each other due to stress. Thus, neutral planes of the panel MB1, the window MB2, and the first and second additional members MB3 and MB4 may be defined independently of each other. In addition, the neutral planes may be defined in the panel MB1, the window MB2, the first additional member MB3, and the second additional member MB4, respectively.

The thickness T-AM1 of the first adhesive layer AM1 may be equal to or less than ½ (half) of a sum of thicknesses of a plurality of adhesive layers located between the panel MB1 and the window MB2. For example, the thickness T-AM1 of the first adhesive layer AM1 may be equal to or less than ½ of a sum of the thickness T-AM1 of the first adhesive layer AM1, the thickness T-AM2 of the second adhesive layer AM2, and the thickness T-AM3 of the third adhesive layer AM3.

In addition, the sum of the thicknesses of the plurality of adhesive layers located between the panel MB1 and the window MB2 may be less than about 200 μm. In FIG. 6, the sum of the thickness T-AM1 of the first adhesive layer AM1, the thickness T-AM2 of the second adhesive layer AM2, and the thickness T-AM3 of the third adhesive layer AM3 may be less than about 200 μm.

Reliability test results of a first comparative example, a second comparative example, and a first embodiment are shown in the following Table 1. Except for the thicknesses T-AM1, T-AM2, and T-AM3 of the first, second, and third adhesive layers AM1, AM2, and AM3, other components of the first and second comparative examples and the first embodiment are substantially the same as each other. In the present test, the window MB2 includes a glass of about 50 μm, the first additional member MB3 includes the optical member, and the second additional member MB4 includes the input sensing member of about 30 μm.

The reliability test results were evaluated by checking whether buckling occurred by interlayer delamination occurring in the bending area BA (see FIG. 2). Inspection of the buckling was performed by checking whether delamination of at least one member occurred in the bending area.

TABLE 1

| | First comparative example | Second comparative example | First embodiment |
|---|---|---|---|
| Thickness (μm) of first adhesive layer AM1 | 100 | 75 | 25 |
| Thickness (μm) of second adhesive layer AM2 | 60 | 75 | 75 |
| Thickness (μm) of third adhesive layer AM3 | 35 | 75 | 75 |

TABLE 1-continued

|  | First comparative example | Second comparative example | First embodiment |
|---|---|---|---|
| Sum (μm) of thicknesses of first to third adhesive layers AM1, AM2, and AM3 | 195 | 225 | 175 |
| Ratio of thickness of first adhesive layer AM1 to sum of thicknesses of adhesive layers | 0.5128 | 0.333 | 0.143 |
| Occurrence of buckling | ○ | ○ | X |

As shown in Table 1, the first comparative example includes the first adhesive layer AM1 having the thickness of 100 μm, the second adhesive layer AM2 having the thickness of 60 μm, and the third adhesive layer AM3 having the thickness of 35 μm. Here, the sum of the thicknesses of the first to third adhesive layers AM1, AM2, and AM3 is 195 μm. In other words, in the first comparative example, the sum of the thicknesses of the first to third adhesive layers AM1, AM2, and AM3 is less than 200 μm, and the thickness of the first adhesive layer AM1 is greater than 97.5 μm, which corresponds to ½ of the sum of the thicknesses of the first to third adhesive layers AM1, AM2, and AM3.

On the other hand, the second comparative example includes the first adhesive layer AM1 having the thickness of 75 μm, the second adhesive layer AM2 having the thickness of 75 μm, and the third adhesive layer AM3 having the thickness of 75 μm. Here, the sum of the thicknesses of the first to third adhesive layers AM1, AM2, and AM3 is 225 μm. In other words, in the second comparative example, the sum of the thicknesses of the first to third adhesive layers AM1, AM2, and AM3 is greater than 200 μm, and the thickness of the first adhesive layer AM1 is less than 112.5 μm, which corresponds to ½ of the sum of the thicknesses of the first to third adhesive layers AM1, AM2, and AM3.

On the contrary, the first embodiment includes the first adhesive layer AM1 having the thickness of 25 μm, the second adhesive layer AM2 having the thickness of 75 μm, and the third adhesive layer AM3 having the thickness of 75 μm. Here, the sum of the thicknesses of the first to third adhesive layers AM1, AM2, and AM3 is 175 μm. Except for the thickness of the first adhesive layer AM1, other components of the first embodiment are substantially the same as corresponding components of the second comparative example. In other words, in the first embodiment, the sum of the thicknesses of the first to third adhesive layers AM1, AM2, and AM3 is less than 200 μm, and the thickness of the first adhesive layer AM1 is less than 87.5 μm, which corresponds to ½ of the sum of the thicknesses of the first to third adhesive layers AM1, AM2, and AM3.

Referring to Table 1, the buckling may easily occur as the sum of the thicknesses of the first to third adhesive layers AM1, AM2, and AM3 increases. When the first embodiment is compared with the second comparative example, buckling occurred in the second comparative example in which the sum of the thicknesses of the first to third adhesive layers AM1, AM2, and AM3 was greater than 200 μm, but buckling did not occur in the first embodiment in which the sum of the thicknesses of the first to third adhesive layers AM1, AM2, and AM3 was less than 200 μm. Thus, according to the present embodiment, the sum of the thicknesses of the first to third adhesive layers AM1, AM2, and AM3 may be limited to less than 200 μm.

In addition, when the first embodiment is compared with the first comparative example, the buckling occurred in the first comparative example in which the ratio of the thickness of the first adhesive layer AM1 to the sum of the thicknesses is great even though the sum of the thicknesses is less than 200 μm. This means that the folding characteristic may be affected by the ratio of the thickness of the first adhesive layer AM1 to the sum of the thicknesses.

As the ratio of the thickness of the first adhesive layer AM1 to the sum of the thicknesses of the first to third adhesive layers AM1 to AM3 increases, flexibility of the first adhesive layer AM1 may be reduced. Thus, the folding characteristic of the panel MB1 being in contact with the first adhesive layer AM1 or the electronic device EA including the same may be deteriorated. However, according to the embodiments disclosed herein, the thickness of the first adhesive layer AM1 may be controlled or adjusted to be equal to or less than ½ of the sum of the thicknesses of the first to third adhesive layers AM1, AM2, and AM3 in the electronic device EA, and thus it is possible to reduce or minimize occurrence of the interlayer delamination and buckling otherwise caused by folding stress. As a result, the electronic device EA may have the improved reliability with respect to the folding stress.

According to an embodiment of the invention, the sum of the thicknesses of the first to third adhesive layers AM1, AM2, and AM3 may be equal to or greater than about 75 μm. Hereinafter, this will be described with reference to the following Table 2.

TABLE 2

|  | First structure | Second structure | Third structure |
|---|---|---|---|
| Thickness (μm) of first adhesive layer AM1 | 10 | 25 | 25 |
| Thickness (μm) of second adhesive layer AM2 | 25 | 25 | 50 |
| Thickness (μm) of third adhesive layer AM3 | 25 | 25 | 25 |
| Sum (μm) of thicknesses of first to third adhesive layers AM1, AM2, and AM3 | 60 | 75 | 100 |
| Breakage test result | 14 | 13 | 15 |
| Impact test result | 8 | 9 | 11 |

Table 2 shows the reliability test results of the first to third structures. The reliability test results shown in Table 2 include breakage test results and impact test results. In the present tests, the breakage test was performed by a pen drop method, and the impact test was performed by a DuPont impact method ("DuPont" is a registered trademark, and is registered to E. I. du Pont de Nemours and Company, a Delaware Corporation). Result values of the breakage test correspond to heights at which the breakage occurs, and result values of the impact test correspond to heights at which a stab occurs.

Except for the thicknesses of the first to third adhesive layers, other components of the first to third structures are substantially the same as each other. As shown in Table 2, the sum of the thicknesses of the first to third adhesive layers AM1, AM2, and AM3 of each of the first to third structures was less than 200 µm. Although the first structure shows a relatively good breakage test result, the first structure shows a relatively low impact test result. When the value of the impact test result is less than 9, a structure may have impact resistance that is unsuitable or is difficult to apply to products. Thus, it may be difficult to apply the first structure to products. On the contrary, the second structure in which the sum of the thicknesses is 75 µm shows a good breakage test result and a good impact test result, and the third structure in which the sum of the thicknesses is 100 µm also shows a good breakage test result and a good impact test result.

As the sum of the thicknesses of the first to third adhesive layers AM1, AM2, and AM3 increases, it is possible to inhibit or prevent an external impact provided to the window MB2 from being transmitted to the panel MB1. Thus, the impact resistance of the electronic device EA may be improved by increasing the sum of the thicknesses of the first to third adhesive layers AM1, AM2, and AM3.

However, as the sum of the thicknesses of the first to third adhesive layers AM1, AM2, and AM3 increases, stress applied to the panel MB1 may increase when the electronic device EA is folded. Therefore, the folding characteristic of the electronic device EA may be deteriorated by the increase in sum of the thicknesses of the first to third adhesive layers AM1, AM2, and AM3. In the electronic device EA according to the embodiments disclosed herein, the sum of the thicknesses of the first to third adhesive layers AM1, AM2, and AM3 may be equal to or greater than about and less than about 200 µm, and the ratio of the thickness of the first adhesive layer AM1 to the sum of the thicknesses may be about ½ or less. As a result, the electronic device EA may have both the improved impact resistance and the improved folding characteristic.

Figure 7A:
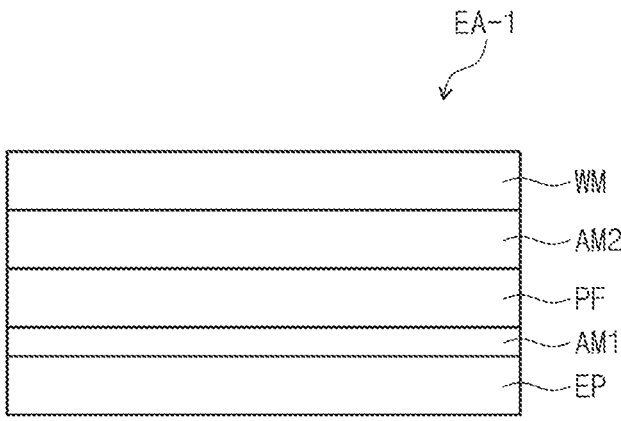
FIGS. 7A to 7C are cross-sectional views schematically illustrating electronic devices according to some embodiments disclosed herein.
Figure 7B:
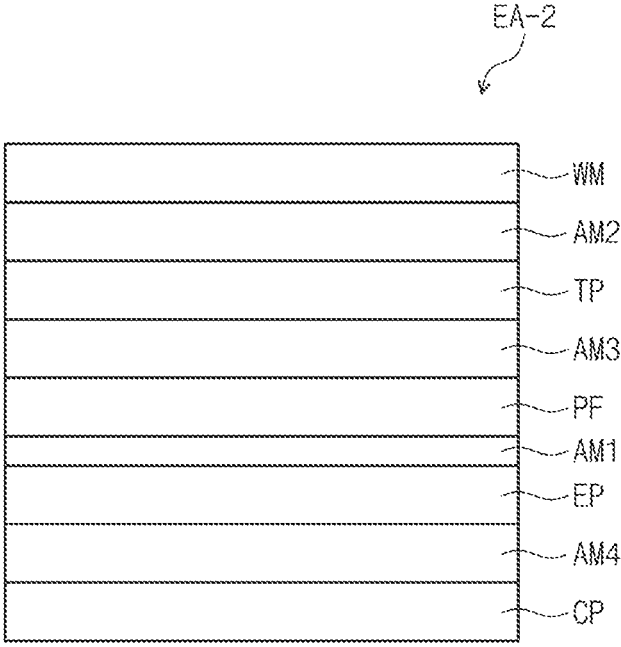
Figure 7C:
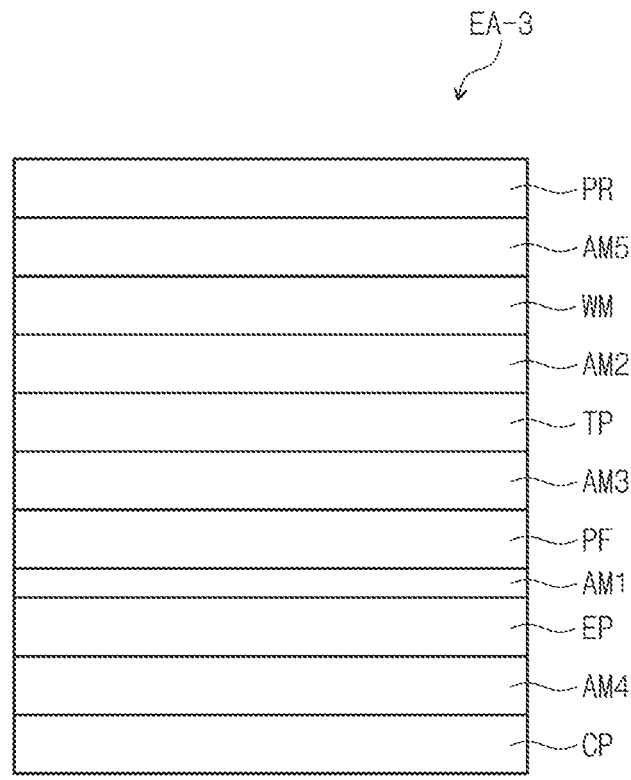

FIGS. 7A to 7C are cross-sectional views schematically illustrating electronic devices according to some embodiments disclosed herein. Cross-sectional views of electronic devices EA-1, EA-2, and EA-3 in an unfolded state are schematically illustrated in FIGS. 7A to 7C for the purpose of ease and convenience in description and illustration. Hereinafter, the electronic devices EA-1, EA-2, and EA-3 according to some embodiments disclosed herein will be described with reference to FIGS. 7A to 7C. In the present embodiments, the same components as described with reference to FIGS. 1 to 6 will be indicated by the same reference designators, and repeated descriptions thereto will be omitted or mentioned briefly.

As illustrated in FIG. 7A, the electronic device EA-1 may include an panel EP, a window WM, an optical member PF, a first adhesive layer AM1, and a second adhesive layer AM2. The panel EP, the window WM, the first adhesive layer AM1, and the second adhesive layer AM2 may correspond to the first member MB1, the second member MB2, the first adhesive layer AM1, and the second adhesive layer AM2 of FIG. 1, respectively.

In other words, the electronic device EA-1 may be realized by omitting one of the first and second additional members MB3 and MB4 and the third adhesive layer AM3 from the electronic device EA of FIG. 1. The optical member PF may correspond to one of the first and second additional members MB3 and MB4 illustrated in FIG. 1.

Thus, the optical member PF may be in contact with the first adhesive layer AM1 and the second adhesive layer AM2. The first adhesive layer AM1 physically couples the optical member PF and the panel EP to each other, and the second adhesive layer AM2 physically couples the optical member PF and the window WM to each other. In another embodiment, the optical member PF may be replaced with an input sensing member. However, the invention is not limited to one of these embodiments. Hereinafter, duplicated descriptions will be omitted.

As illustrated in FIG. 7A, one adhesive layer is omitted in the electronic device EA-1. Thus, a sum of thicknesses of adhesive layers located between the panel EP and the window WM may be defined as a sum of thicknesses of the first and second adhesive layers AM1 and AM2.

In other words, the electronic device EA-1 may be realized by omitting the first additional member MB3 and directly coupling of the first adhesive layer AM1 and the third adhesive layer AM3 from the electronic device EA of FIG. 1. The optical member PF may correspond to the second additional member MB4 illustrated in FIG. 1. The first adhesive layer AM1 illustrated in FIG. 7A may be formed by stacking a plurality of adhesive layers.

In other words, the electronic device EA-1 may be realized by omitting the second additional member MB4, and by directly coupling the second adhesive layer AM2 and the third adhesive layer AM3 from the electronic device EA of FIG. 1. The optical member PF may correspond to the first additional member MB3 illustrated in FIG. 1. The second adhesive layer AM2 illustrated in FIG. 7A may be formed by stacking a plurality of adhesive layers. However, the invention is not limited to any one of these embodiments.

According to embodiments of the invention, the sum of the thicknesses of the first and second adhesive layers AM1 and AM2 may be designed to be less than about 200 µm. In addition, the thickness of the first adhesive layer AM1 being in contact with the panel EP may be designed to be equal to or less than about ½ of the sum of the thicknesses of the first and second adhesive layers AM1 and AM2. Even though one or some adhesive layers are omitted, the electronic device EA-1 may have both the improved folding characteristic and the improved strength because the thicknesses of the first and second adhesive layers AM1 and AM2 are controlled or adjusted to satisfy the above conditions.

As illustrated in FIG. 7B, the electronic device EA-2 may further include a lower panel CP and a fourth adhesive layer AM4. Except for the lower panel CP and the fourth adhesive layer AM4, other components of the electronic device EA-2 may be substantially the same as the components of the electronic device EA illustrated in FIG. 1. In more detail, the electronic device EA-2 may include an panel EP corresponding to the panel MB1 of FIG. 1, a window WM corresponding to the window MB2 of FIG. 1, an optical panel PF corresponding to the first additional member MB3 of FIG. 1, and an input sensing panel TP corresponding to the second additional member MB4 of FIG. 1. Hereinafter, duplicated descriptions will be omitted.

The lower panel CP is located on a back surface of the panel EP to protect the panel EP. The lower panel CP supplements the impact resistance of the panel EP. Because the electronic device EA-2 further includes the lower panel CP, strength of the electronic device EA-2 may be further improved.

Reliability test results of embodiments related to this are shown in the following Table 3. Except for the lower panel, a first embodiment and a third embodiment of the following Table 3 include substantially similar components.

TABLE 3

| | First embodiment | Third embodiment |
|---|---|---|
| Thickness (μm) of first adhesive layer AM1 | 25 | 25 |
| Thickness (μm) of second adhesive layer AM2 | 75 | 75 |
| Thickness (μm) of third adhesive layer AM3 | 75 | 75 |
| Sum (μm) of thicknesses of first to third adhesive layers AM1, AM2, and AM3 | 175 | 175 |
| Lower panel | X | ◯ |
| Breakage test result value | 3 | 2 |
| Impact test result value | 9 | 13 |

The first embodiment does not include the lower panel, and may correspond to the first embodiment shown in Table 1. The third embodiment includes the lower panel, and may correspond to the electronic device EA-2 illustrated in FIG. 7B. As shown in Table 3, the impact test result value of the third embodiment is greater than that of the first embodiment. In other words, because the electronic device EA-2 further includes the lower panel CP, the strength of the electronic device EA-2 with respect to an external impact may be improved, and the reliability of the electronic device EA-2 may also be improved during use.

The lower panel CP may be variously embodied. For example, the lower panel CP may include a cushion layer or a metal. The lower panel CP may be a protective sheet or a bottom chassis. In the case that the panel EP has a low rigidity, for instance the base substrate SUB of the panel EP illustrated in FIG. 6 has a modulus of about 10 GPa or lower, the electronic device EA-2 can protect the panel EP by further including the lower panel CP.

The fourth adhesive layer AM4 is located between the lower panel CP and the panel EP to physically couple the lower panel CP and the panel EP to each other. Because the fourth adhesive layer AM4 is located on the back surface of the panel EP, the fourth adhesive layer AM4 is not included in a plurality of adhesive layers located between the panel EP and the window WM. Thus, the fourth adhesive layer AM4 may not affect the thickness design of the first adhesive layer AM1 according to the embodiments described above.

The fourth adhesive layer AM4 may include an adhesive material. For example, the fourth adhesive layer AM4 may include a pressure sensitive adhesive (PSA), an optical clear adhesive (OCA), an optical clear resin (OCR), or a double-sided tape.

Meanwhile, the fourth adhesive layer AM4 may have both adhesion and elasticity. For example, the fourth adhesive layer AM4 may include an adhesive resin including epoxy, urethane, or silicon. In the case that the panel EP has high rigidity, the electronic device EA-2 can obtain the improved impact resistance by the fourth adhesive layer AM4. For instance, in the case that the base substrate SUB of the panel EP illustrated in FIG. 6 has a modulus that is higher than about 10 GPa, the electronic device EA-2 can protect the panel EP by further including the fourth adhesive layer AM4. The fourth adhesive layer AM4 may include various embodiments, and is not limited to any particular embodiment.

As illustrated in FIG. 7C, the electronic device EA-3 may further include a protective panel PR and an upper adhesive layer AM5. Except for the protective panel PR and the upper adhesive layer AM5, other components of the electronic device EA-3 may be substantially the same as the components of the electronic device EA-2 illustrated in FIG. 7B. Thus, detailed descriptions to the other components are omitted.

The protective panel PR is located on a front surface of the window WM to protect the window WM. Thus, the protective panel PR may have relatively high strength.

For example, the protective panel PR may have a modulus of about 1 GPa or more. For example, the protective panel PR may include polycarbonate (PC) or polyethylenetereph-thalate (PET). Here, the protective panel PR may have sufficient strength even though the protective panel PR has a thin thickness of about 15 μm or more.

Alternatively, the protective panel PR may have a modulus of about 1 GPa or less. For example, the protective panel PR may include thermoplastic polyurethane (TPU). At this time, the protective panel PR may have a relatively thick thickness of about 50 μm or more to secure sufficient strength. According to embodiments disclosed herein, even though the electronic device EA-3 further includes the protective panel PR having at least one selected from various moduli, the electronic device EA-3 may have the improved impact resistance by adjusting the thickness of the protective panel PR. Even though not shown in the drawings, the protective panel PR may further include a coating layer (e.g., a hard coating layer or an anti-reflection layer) covering the front surface of the window WM.

Reliability test results of embodiments related to this are shown in the following Table 4. Except for the protective panel, a third embodiment and a fourth embodiment of the following Table 4 include substantially similar components.

TABLE 4

| | Third embodiment | Fourth embodiment | Fifth embodiment | Sixth embodiment | Seventh embodiment |
|---|---|---|---|---|---|
| Modulus of protective panel PR | X | 440 MPa | 440 MPa | 2~4 GPa | 6~9 GPa |
| Thickness (μm) of protective panel PR | X | 100 | 200 | 55 | 14 |
| Thickness (μm) of first adhesive layer AM1 | 25 | 25 | 25 | 25 | 25 |
| Thickness | 50 | 50 | 50 | 50 | 50 |

US 12,693,710 B2

TABLE 4-continued

|  | Third embodiment | Fourth embodiment | Fifth embodiment | Sixth embodiment | Seventh embodiment |
|---|---|---|---|---|---|
| (μm) of second adhesive layer AM2 Thickness (μm) of third adhesive layer AM3 | 25 | 25 | 25 | 25 | 25 |
| Sum (μm) of thicknesses of first to third adhesive layers AM1, AM2, and AM3 | 100 | 100 | 100 | 100 | 100 |
| Breakage test result | 2 | 11 | 15 | 14 | 8 |
| Impact test result | 4 | 6 | 11 | 5 | 6 |

The sums (μm) of the thicknesses of the first to third adhesive layers AM1, AM2, and AM3 of the third to seventh embodiments are equal to each other. In other words, the sum of the thicknesses of the adhesive layers located between the panel and the window is 100 μm in each of the third to seventh embodiments. Protective panel conditions of the third to seventh embodiments, however, are different from each other.

The third embodiment does not include the protective panel PR, and may correspond to the third embodiment shown in Table 3. The fourth to seventh embodiments include respective protective panels PR, and may correspond to the electronic device EA-3 illustrated in FIG. 7C. The protective panels PR included in the fourth to seventh embodiments have different thicknesses and/or different moduli.

As shown in Table 4, the breakage test result values of the fourth to seventh embodiments are greater than that of the third embodiment. As described above, the breakage test may be a resistance test with respect to an impact applied to the window WM, such as the pen drop method. Because the electronic device EA-3 further includes the protective panel PR, the resistance with respect to an external impact applied toward the window WM can be improved.

The protective panels PR of the fourth and fifth embodiments have moduli less than 1 GPa. In the present test, each of the fourth and fifth embodiments includes thermoplastic polyurethane (TPU). Thus, the protective panel PR of each of the fourth and fifth embodiments has the modulus of about 440 MPa. However, this modulus is a value measured at a low temperature. The protective panels PR of the fourth and fifth embodiments may have moduli of about 34 MPa at room temperature.

The protective panel of the fourth embodiment has the thickness of about 100 μm, and the protective panel of the fifth embodiment has the thickness of about 200 μm. Here, in the breakage test and the impact test, the strength of the fifth embodiment is higher than that of the fourth embodiment. According to embodiments disclosed herein, when the protective panel has the modulus less than 1 GPa, the strength of the protective panel may increase as the thickness of the protective panel increases. In particular, when the protective panel has the thickness of 100 μm or more, the strength of the protective panel may be more improved.

The protective panels PR of the sixth and seventh embodiments have moduli greater than 1 GPa. In the present test, each of the sixth and seventh embodiments includes polyethyleneterephthalate (PET). Thus, the protective panel of the sixth embodiment has the modulus of about 2 GPa to about 4 GPa, and the protective panel of the seventh embodiment has the modulus of about 6 GPa to about 9 GPa.

The protective panel of the sixth embodiment has the thickness of about 55 μm, and the protective panel of the seventh embodiment has the thickness of about 14 μm. Here, in the breakage test, the strength of the sixth embodiment is higher than that of the seventh embodiment. In the impact test, the strength of the seventh embodiment is greater than that of the sixth embodiment, but a difference therebetween is very small. However, in the breakage test, a difference between the result values of the sixth and seventh embodiments is relatively large, and the result value of the sixth embodiment is similar to that of the fifth embodiment. According to embodiments disclosed herein, when the protective panel has the modulus of about 1 GPa or more, the protective panel may have a high strength even though the protective panel is relatively thin. In particular, when the protective panel has the thickness of about 15 μm or more, the strength of the protective panel may be more improved.

According to the present embodiment, because the electronic device EA-3 further includes the protective panel PR, the strength of the electronic device EA-3 with respect to an external impact may be improved, and the reliability of the electronic device EA-3 may also be improved during use.

Figure 8A:
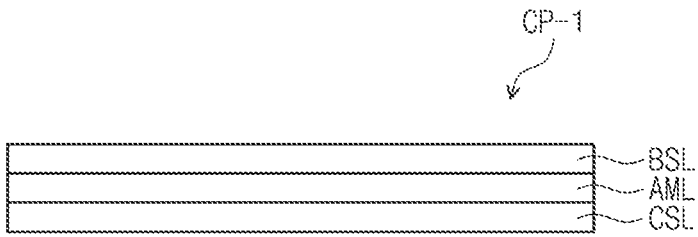
FIGS. 8A and 8B are cross-sectional views schematically illustrating lower panels according to some embodiments disclosed herein.
Figure 8B:
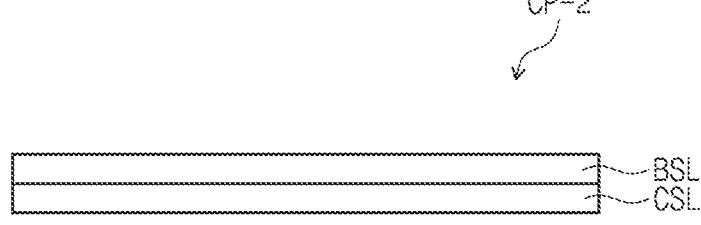

FIGS. 8A and 8B are cross-sectional views schematically illustrating lower panels according to some embodiments disclosed herein. Lower panels CP-1 and CP-2 according to some embodiments disclosed herein will be described with reference to FIGS. 8A and 8B.

As illustrated in FIG. 8A, the lower panel CP-1 may include a cushion layer CSL, an adhesive layer AML, and a support layer BSL. The cushion layer CSL may have elasticity (e.g., a predetermined elasticity). A shape of the cushion layer CSL may be changed or deformed to absorb an impact applied to the lower panel CP-1. The cushion layer CSL may include an elastic resin (e.g., polyurethane), a sponge, or rubber.

The support layer BSL may be a layer to which the cushion layer CSL is coupled. The cushion layer CSL may be coupled to the support layer BSL by the adhesive layer AML, and may be provided to the electronic device.

The support layer BSL may include a metal. The support layer BSL may stably conduct, discharge, or dissipate heat generated from the panel EP to the outside. However, embodiments disclosed herein are not limited thereto. In another embodiment, the support layer BSL may include an insulating material.

Meanwhile, the support layer BSL may include a material having a high strength. The support layer BSL may be coupled to the panel EP (see FIG. 7B) through the fourth adhesive layer AM4 (see FIG. 7B). Thus, the support layer BSL may supplement the strength of the panel EP. According to the present embodiment, because the electronic device includes the lower panel CP-1, heat dissipation characteristics and impact resistance of the electronic device may be improved.

As illustrated in FIG. 8B, the adhesive layer AML may be omitted from the lower panel CP-2. In the lower panel CP-2, the cushion layer CSL may be in direct contact with the support layer BSL. For example, the cushion layer CSL may be formed directly on a back surface of the support layer BSL by a foaming process.

Thus, the cushion layer CSL may be stably coupled to the support layer BSL without the adhesive layer AML. In addition, because a separation problem of the adhesive layer AML is prevented, it is possible to prevent the cushion layer CSL and the support layer BSL from being separated from each other when heat or an impact is applied thereto. As a result, the reliability of the electronic device may be improved.

The lower panels CP-1 and CP-2 according to some embodiments disclosed herein may have various structures. In other words, the lower panels CP-1 and CP-2 may have various structures under the condition that they protect the back surface of the panel EP to improve the impact resistance of the electronic device.

Figure 9A:
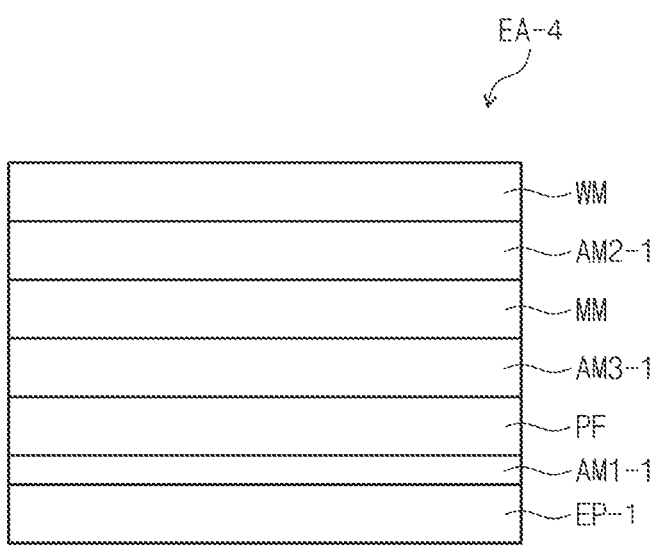
FIG. 9A is a cross-sectional view schematically illustrating an electronic device according to an embodiment of the invention.
Figure 9B:
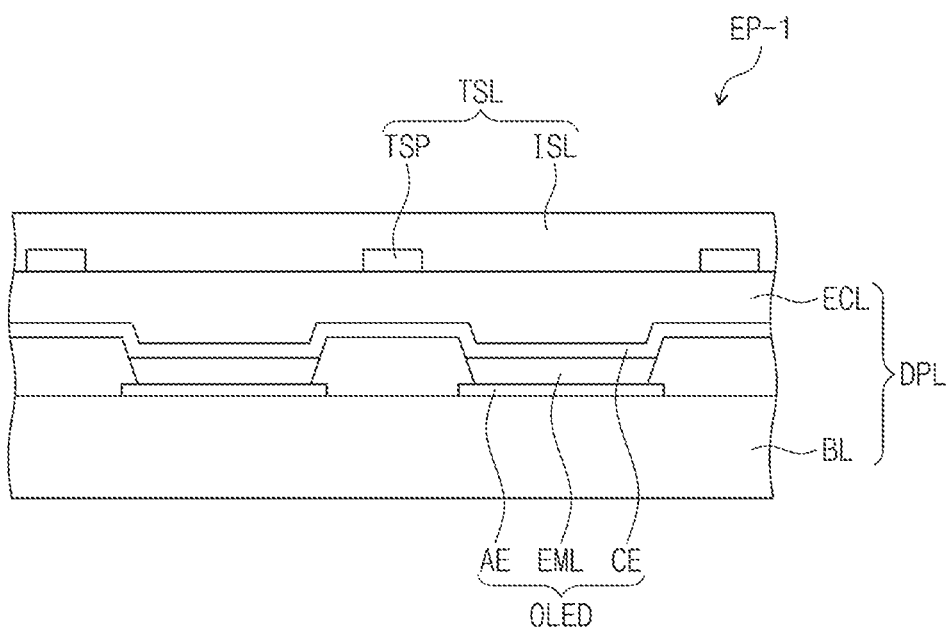
FIG. 9B is a cross-sectional view schematically illustrating some components of the electronic device of FIG. 9A.

FIG. 9A is a cross-sectional view schematically illustrating an electronic device according to an embodiment of the invention. FIG. 9B is a cross-sectional view schematically illustrating some components of the electronic device of FIG. 9A. Hereinafter, an electronic device EA-4 according to an embodiment of the invention will be described with reference to FIGS. 9A and 9B. In the present embodiment, the same components as described with reference to FIGS. 1 to 8B will be indicated by the same reference designators, and the descriptions thereto will be omitted or mentioned briefly.

As illustrated in FIG. 9A, the electronic device EA-4 may include an panel EP-1, a window WM, an optical member PF, a supplementary member MM, a first adhesive layer AM1-1, a second adhesive layer AM2-1, and a third adhesive layer AM3-1. Except for the panel EP-1, the supplementary member MM, and the first to third adhesive layers AM1-1, AM2-1 and AM3-1, other components of the electronic device EA-4 may be substantially the same as corresponding components of the electronic device EA-1 illustrated in FIG. 7A. Thus, repeated detailed descriptions to the window WM and the optical member PF will be omitted.

As illustrated in FIGS. 9A and 9B, the panel EP-1 may include a display layer DPL and a touch sensing layer TSL. The display layer DPL displays an image. The display layer DPL may include a base layer BL, a display element OLED, and an encapsulation layer ECL. The display element OLED is located between the base layer BL and the encapsulation layer ECL. The display element OLED may be an organic light emitting element. The display element OLED includes a first electrode AE, a light emitting layer EML, and a second electrode CE. In the present embodiment, the display layer DPL may substantially correspond to the panel MB1 illustrated in FIG. 5.

In other words, the panel EP-1 may have a structure including the panel MB1 of FIG. 5 and the touch sensing layer TSL. The touch sensing layer TSL may be located on a front surface of the display layer DPL. However, embodiments disclosed herein are not limited thereto. In other embodiments, the touch sensing layer TSL may be located on a back surface of the display layer DPL or may be inserted in the display layer DPL.

The touch sensing layer TSL senses a touch provided from the outside. In the present embodiment, the touch sensing layer TSL may sense touch, proximity, or pressure.

The touch sensing layer TSL may include a touch sensor pattern TSP and an insulating layer ISL. The touch sensor pattern TSP may have conductivity. The touch sensor pattern TSP is illustrated as a single layer. However, in another embodiment, the touch sensor pattern TSP may include a plurality of layers spaced apart from each other by an insulating layer. The touch sensor pattern TSP may include a mesh pattern or a pattern overlapping with the light emitting layer EML. The touch sensor pattern TSP may be transparent or opaque. However, embodiments disclosed herein are not limited thereto.

The insulating layer ISL covers the touch sensor pattern TSP. The insulating layer ISL insulates the touch sensor pattern TSP from the outside and forms a capacitance between the touch sensor patterns TSP. The touch sensing layer TSL may sense a position or strength of a touch provided from the outside by using a change in capacitance between the touch sensor patterns TSP. However, embodiments disclosed herein are not limited thereto. The structure of the touch sensing layer TSL may be variously modified depending on a sensing method.

The touch sensing layer TSL may have substantially the same function as the input sensing panel TP illustrated in FIG. 7B. In other words, in the electronic device EA-4 according to the present embodiment, the input sensing panel TP (see FIG. 7B) may be inserted in the panel EP-1.

Referring again to FIG. 9A, as a result, the electronic device EA-4 may further include the supplementary member MM. The supplementary member MM may be one component of the additional member MB4 (see FIG. 1). The supplementary member MM is located between the second adhesive layer AM2-1 and the third adhesive layer AM3-1.

The supplementary member MM may include an insulating material. For example, the supplementary member MM may include a transparent resin.

In the present embodiment, a sum of thicknesses of the first to third adhesive layers AM1-1, AM2-1, and AM3-1 may be less than about 200 μm. In addition, the thickness of the first adhesive layer AM1-1 may be equal to or less than about ½ of the sum of the thicknesses of the first to third adhesive layers AM1-1, AM2-1, and AM3-1. Thus, the electronic device EA-4 may have flexibility and may also have the improved impact resistance.

The supplementary member MM may supplement omission of the input sensing panel TP (see FIG. 7B) from the electronic device EA-2 of FIG. 7B. Thus, the supplementary member MM may be controlled to have a modulus and a thickness which are similar to those of the input sensing panel TP (see FIG. 7B).

At this time, the first to third adhesive layers AM1-1, AM2-1, and AM3-1 may correspond to the first to third adhesive layers AM1, AM2, and AM3 of the electronic device EA-2 of FIG. 7B, respectively. According to the invention, because the supplementary member MM having the controlled modulus and thickness is added into the electronic device EA-4, the existing structure can be applied to the electronic device EA-4 without a design change even though a component (e.g., the input sensing panel TP) is omitted. As a result, the design of the stack structure of the electronic device EA-4 may be simplified.

Figure 10:
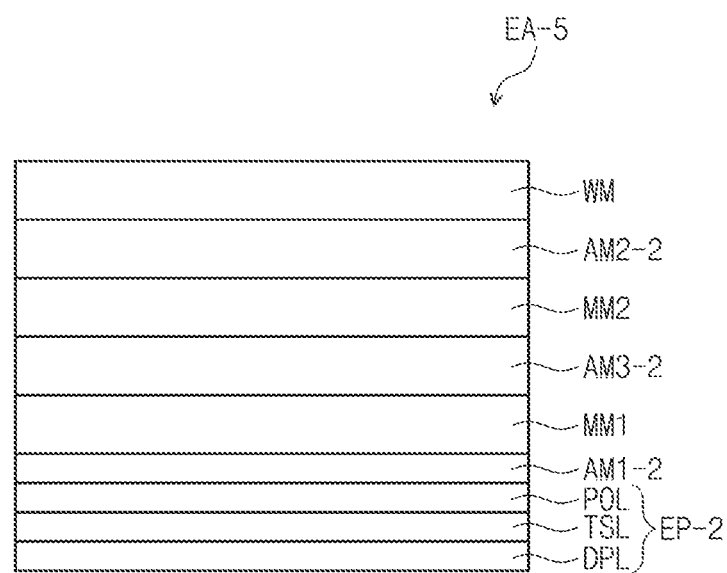
FIG. 10 is a cross-sectional view schematically illustrating an electronic device according to an embodiment of the invention.
Figure 11:
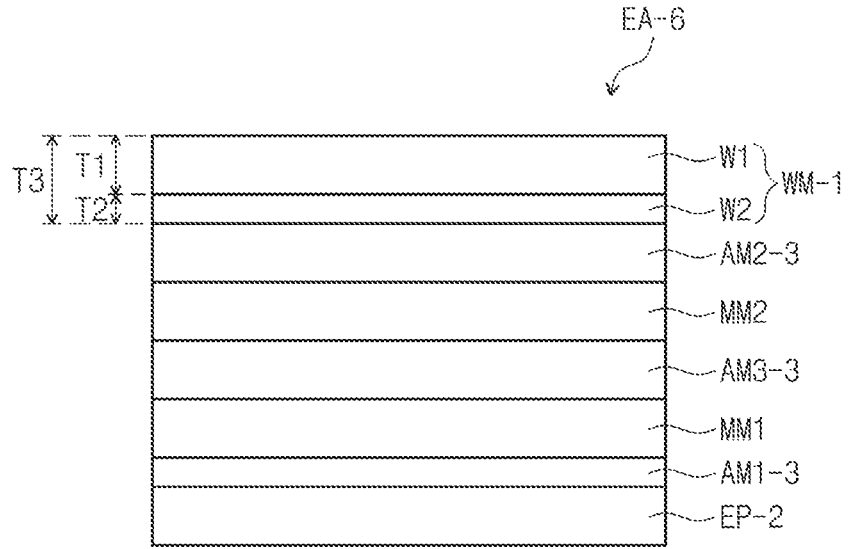
FIG. 11 is a cross-sectional view schematically illustrating an electronic device according to an embodiment of the invention.

FIG. 10 is a cross-sectional view schematically illustrating an electronic device according to an embodiment of the invention. FIG. 11 is a cross-sectional view schematically illustrating an electronic device according to an embodiment of the invention. Hereinafter, electronic devices EA-5 and EA-6 of different embodiments will be described with reference to FIGS. 10 and 11. In the present embodiments, the same components as those described with reference to FIGS. 1 to 9B will indicated by the same reference designators, and repeated descriptions thereof will be omitted or mentioned briefly.

As illustrated in FIG. 10, the electronic device EA-5 may include a panel EP-2, a window WM, a first supplementary member MM1, a second supplementary member MM2, and first to third adhesive layers AM1-2, AM2-2, and AM3-2. The panel EP-2 may include a display layer DPL, a touch sensing layer TSL, and an optical layer POL. The display layer DPL and the touch sensing layer TSL may correspond to the display layer DPL and the touch sensing layer TSL of FIG. 9B, respectively. Thus, detailed descriptions to the display layer DPL and the touch sensing layer TSL are omitted.

In other words, the panel EP-2 may have a structure obtained by adding the optical layer POL to the panel EP-1 of FIG. 9B. The optical layer POL may reduce a reflectance of light incident on a front surface of the panel EP-2. The optical layer POL may include a polarizing layer or a color filter layer.

The first supplementary member MM1 and the second supplementary member MM2 may correspond to the additional members MB3 and MB4 (see FIG. 1). Each of the first and second supplementary members MM1 and MM2 may include a transparent resin. Each of the first and second supplementary members MM1 and MM2 may be a transparent film or a transparent substrate that does not include an additional electronic element.

The first adhesive layer AM1-2 is located between the panel EP-2 and the first supplementary member MM1 to physically couple the panel EP-2 and the first supplementary member MM1 to each other. The second adhesive layer AM2-2 is located between the window WM and the second supplementary member MM2 to physically couple the window WM and the second supplementary member MM2 to each other. The third adhesive layer AM3-2 is located between the first supplementary member MM1 and the second supplementary member MM2 to physically couple the first and second supplementary members MM1 and MM2 to each other.

A sum of thicknesses of the first to third adhesive layers AM1-2, AM2-2, and AM3-2 may be less than about 200 μm. In addition, the thickness of the first adhesive layer AM1-2 may be equal to or less than about ½ of the sum of the thicknesses of the first to third adhesive layers AM1-2, AM2-2, and AM3-2.

The optical layer POL may have substantially the same function as the optical panel (or the optical member) PF illustrated in FIG. 7B. In other words, the electronic device EA-5 according to the present embodiment may include a structure in which the optical panel PF and the input sensing panel TP are inserted in the panel EP.

Thus, the electronic device EA-5 may further include the first supplementary member MM1 and the second supplementary member MM2. When the electronic device EA-5 is compared with the electronic device EA-2 of FIG. 7B, the first supplementary member MM1 may be added due to omission of the optical panel PF (see FIG. 7B), and the second supplementary member MM2 may be added due to omission of the input sensing panel TP (see FIG. 7B).

Thus, a modulus and a thickness of the first supplementary member MM1 may be controlled to be similar to those of the optical panel PF, and a modulus and a thickness of the second supplementary member MM2 may be controlled to be similar to those of the input sensing panel TP. At this time, the first to third adhesive layers AM1-2, AM2-2, and AM3-2 may correspond to the first to third adhesive layers AM1, AM2, and AM3 of the electronic device EA-2 of FIG. 7B, respectively. According to the invention, the supplementary members MM1 and MM2, the moduli and thicknesses of which are controlled to correspond to those of omitted panels, respectively, may be added into the electronic device. Thus, the existing structure can be applied to the electronic device without a design change even though some components (e.g., the input sensing panel TP and/or optical panel PF) are omitted. As a result, a design of the stack structure of the electronic device may be simplified.

As illustrated in FIG. 11, the electronic device EA-6 may include a panel EP-2, a window WM-1, a first supplementary member MM1, a second supplementary member MM2, and first to third adhesive layers AM1-3, AM2-3, and AM3-3. Except for the window WM-1 and the first to third adhesive layers AM1-3, AM2-3, and AM3-3, other components of the electronic device EA-6 may be substantially the same as corresponding components of the electronic device EA-5 illustrated in FIG. 10. Thus, repeated detailed descriptions to the panel EP-2 and the first and second supplementary members MM1 and MM2 are omitted.

The window WM-1 may include a first layer W1 and a second layer W2. The first layer W1 may form a front surface of the electronic device EA-6. The first layer W1 may include substantially the same material as the window WM illustrated in FIG. 10.

The second layer W2 may include a material that is different from that of the first layer W1. The second layer W2 may include a material that has a modulus that is lower than that of the first layer W1. For example, the second layer W2 may have a modulus of about 10 GPa or less.

A sum T3 of a thickness T1 of the first layer W1 and a thickness T2 of the second layer W2 may substantially correspond to a thickness of the window WM illustrated in FIG. 10. In other words, according to the present embodiment, when the first layer W1 includes the same material as the window WM of FIG. 10 but has a thickness that is smaller than that of the window WM of FIG. 10, the second layer W2 having a relatively low modulus may be added to the first layer W1 to form the window WM-1. Thus, the second layer W2 may supplement strength of the first layer W1, which may be weakened by a decrease in thickness. As a result, the window WM-1 with improved impact resistance may be provided or realized.

According to the invention, the thicknesses of the plurality of adhesive layers included in the electronic device may be adjusted or designed (e.g., to be in a suitable range), and thus it is possible to realize the electronic device having the stack structure capable of securing both the flexibility and the strength. As a result, it is possible to provide the electronic device which can relax stress caused by folding and can improve the impact resistance.

While the invention has been described with reference to example embodiments, it will be apparent to those skilled in the art that various changes and modifications may be made without departing from the spirits and scopes of the invention. Therefore, it should be understood that the above embodiments are not limiting, but illustrative. Thus, the scopes of the invention are to be determined by the broadest permissible interpretation of the following claims and their functional equivalents, and shall not be restricted or limited by the foregoing description.

What is claimed is:

1. An electronic device comprising:
a window;
a panel foldable along a folding axis extending in one direction, below the window, and comprising:
a base layer; and
a display element on the base layer for displaying an image;
at least three adhesive layers between the window and the panel, and comprising:
a first adhesive layer contacting the panel;
a second adhesive layer contacting the window; and
a third adhesive layer between the first adhesive layer and the second adhesive layer;
a polarizing member above the panel and below the window; and
an input sensing member for sensing an external touch, the input sensing member being under the polarizing member,
wherein a sum of thicknesses of the adhesive layers is less than 200 μm,
wherein the third adhesive layer is between the polarizing member and the input sensing member,
wherein the thickness of the second adhesive layer is larger than each of those of the first adhesive layer and the third adhesive layer, and
wherein a radius of curvature of the second adhesive layer is greater than that of the first adhesive layer.

2. The electronic device of claim 1, wherein the thickness of the first adhesive layer is equal to or less than ½ of the sum of the thicknesses of the adhesive layers.

3. The electronic device of claim 1, wherein the window has a modulus of 55 GPa to 85 GPa.

4. An electronic device comprising:
a window;
a panel foldable along a folding axis extending in one direction, below the window, and comprising:
a base layer; and
a display element on the base layer for displaying an image;
adhesive layers between the window and the panel; and
a polarizing member above the panel; and
an input sensing member above the panel and below the polarizing member,
wherein the adhesive layers comprise:
a first adhesive layer contacting the panel;
a second adhesive layer between the window and the first adhesive layer and contacting the window; and
a third adhesive layer between the first adhesive layer and the second adhesive layer,
wherein a thickness of the first adhesive layer is equal to or less than ½ of a sum of thicknesses of the adhesive layers,
wherein the third adhesive layer is between the polarizing member and the input sensing member, wherein the thickness of the second adhesive layer is larger than each of those of the first adhesive layer and the third adhesive layer, and
wherein a radius of curvature of the second adhesive layer is greater than that of the first adhesive layer.

5. The electronic device of claim 4, wherein each of the polarizing member and the input sensing member comprises a transparent resin, and wherein the third adhesive layer is between the polarizing member and the input sensing member.

6. The electronic device of claim 4, wherein the sum of the thicknesses of the adhesive layers is less than 200 μm, and is equal to or greater than 75 μm.

7. The electronic device of claim 4, further comprising:
a protective panel on the window; and
an upper adhesive layer between the protective panel and the window to couple the protective panel and the window to each other.

8. The electronic device of claim 4, wherein the window comprises a glass having a modulus of 55 GPa to 85 GPa.

9. The electronic device of claim 4, wherein the window has a thickness of 80 μm or less.

10. The electronic device of claim 4, wherein the input sensing member is located between the second adhesive layer and the third adhesive layer and comprises a supplementary member.

11. The electronic device of claim 10, wherein the supplementary member comprises a transparent resin.

12. The electronic device of claim 4, wherein the panel comprises:
a base substrate having modulus of 1 GPa to 10 GPa;
a pixel defining layer on a front surface of the base substrate and comprising a plurality of pixels; and
an encapsulation layer covering the pixel defining layer, and
wherein the panel is configured to display an image on a front surface thereof.

13. The electronic device of claim 4, wherein the folding axis is defined on a back surface of the panel,
wherein the folding axis is parallel to the back surface of the panel, and
wherein the panel and the window are foldable along the folding axis.

14. An electronic device comprising:
a panel, foldable along a folding axis extending in one direction, comprising:
a base layer; and
a display element on the base layer for displaying an image;
a window above a front surface of the panel;
an input sensing member above the panel and below the window;
a polarizing member above the input sensing member and below the window; and
a plurality of adhesive layers between the window and the panel, and comprising:
a first adhesive layer on the panel;
a second adhesive layer between the first adhesive layer and the window, and contacting a lower surface of the window; and
a third adhesive layer between the polarizing member and the input sensing member,
wherein a sum of thicknesses of the adhesive layers is between 75 μm and 200 μm,
wherein a thickness of the first adhesive layer is equal to or less than ½ of the sum of the thicknesses of the adhesive layers, wherein the thickness of the second adhesive layer is larger than each of those of the first adhesive layer and the third adhesive layer, and wherein a radius of curvature of the second adhesive layer is greater than that of the first adhesive layer.

15. An electronic device comprising:

a panel foldable along a folding axis extending in one direction, and comprising:

a base layer; and a display layer on the base layer for displaying an image;

a window above a front surface of the panel;

a protective layer above a front surface of the window;

a lower panel below a back surface of the panel;

an input sensing member above the panel;

a polarizing member above the input sensing member and below the window; and a plurality of adhesive layers between the window and the lower panel, and comprising:

a first adhesive layer on the panel;

a second adhesive layer between the first adhesive layer and the window;

a third adhesive layer between the input sensing member and the polarizing member; and a fourth adhesive layer between the panel and the lower panel, wherein a sum of thicknesses of the adhesive layers is less than 200 μm, wherein a thickness of the first adhesive layer is equal to or less than ½ of the sum of the thicknesses of the adhesive layers, wherein the thickness of the second adhesive layer is larger than each of those of the first adhesive layer and the third adhesive layer, and wherein a radius of curvature of the second adhesive layer is greater than that of the first adhesive layer.

16. The electronic device of claim 15, further comprising an optical member between the panel and the window, wherein the third adhesive layer is between the optical member and the input sensing member.

17. The electronic device of claim 15, wherein the protective layer comprises at least one of polycarbonate (PC), polyethyleneterephthalate (PET), or thermoplastic polyurethane (TPU).

18. The electronic device of claim 15, wherein the window comprises:

a first layer including a glass; and a second layer including a transparent resin and having a modulus that is lower than that of the first layer, and wherein a sum of thicknesses of the first and second layers is equal to or less than 80 μm.

* * * * *